(12) United States Patent
Guler et al.

(10) Patent No.: US 12,720,820 B2
(45) Date of Patent: Aug. 25, 2026

(54) PARTIAL GATE CUT STRUCTURES IN AN INTEGRATED CIRCUIT

(71) Applicant: Intel Corporation, Santa Clara, CA (US)

(72) Inventors: Leonard P. Guler, Hillsboro, OR (US); Tahir Ghani, Portland, OR (US); Saurabh Morarka, Portland, OR (US); Charles H. Wallace, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 300 days.

(21) Appl. No.: 17/697,129

(22) Filed: Mar. 17, 2022

(65) Prior Publication Data

US 2023/0299135 A1 Sep. 21, 2023

(51) Int. Cl.

| | |
|---|---|
| ***H10D 62/10*** | (2025.01) |
| ***H10D 30/67*** | (2025.01) |
| ***H10D 64/01*** | (2025.01) |
| ***H10D 84/83*** | (2025.01) |

(52) U.S. Cl.

CPC ....... *H10D 62/118* (2025.01); *H10D 30/6713* (2025.01); *H10D 30/6735* (2025.01); *H10D 30/6757* (2025.01); *H10D 64/021* (2025.01); *H10D 84/834* (2025.01)

(58) Field of Classification Search

CPC .... H10D 30/43; H10D 30/014; H10D 62/119; H01L 29/0669

See application file for complete search history.

(56) References Cited

U.S. PATENT DOCUMENTS

2016/0300948 A1 10/2016 Yang et al.
2020/0105751 A1 * 4/2020 Dewey ................ H10D 62/235
2020/0286891 A1 9/2020 Subramanian et al.

(Continued)

FOREIGN PATENT DOCUMENTS

DE 102020119428 A1 * 9/2021 ..... H01L 21/823425

OTHER PUBLICATIONS

Extended European Search Report received for EP Application No. 23156013.7, dated Aug. 14, 2023. 12 pages.

*Primary Examiner* — Christine S. Kim
*Assistant Examiner* — Andrew Victor Prostor
(74) *Attorney, Agent, or Firm* — Arcane Law PLLC

(57) ABSTRACT

Techniques are provided herein to form an integrated circuit having any number of partial gate cut structures between adjacent semiconductor devices. Neighboring semiconductor devices each include a semiconductor region extending between a source region and a drain region, and a gate structure extending over the semiconductor regions of the neighboring semiconductor devices. In some such examples, a partial gate cut structure is present between a given pair of neighboring semiconductor devices. The partial gate cut structure acts as a dielectric pillar between the semiconductor structures that allows the conductive gate layer (from the gate structure) to extend above and/or below it such that the gates of each of the semiconductor devices remain electrically coupled together. The gate cut structure itself removes a portion of the gate layer from between the semiconductor devices, thus reducing parasitic capacitance.

20 Claims, 16 Drawing Sheets

(56) References Cited

U.S. PATENT DOCUMENTS

| | | | |
|---|---|---|---|
| 2021/0327762 | A1 | 10/2021 | Xie et al. |
| 2021/0343713 | A1* | 11/2021 | Ju ..................... H01L 21/28123 |
| 2021/0359103 | A1 | 11/2021 | Xie et al. |
| 2022/0020859 | A1 | 1/2022 | Cho et al. |
| 2022/0367659 | A1 | 11/2022 | Liaw |

* cited by examiner

204

PARTIAL GATE CUT STRUCTURES IN AN INTEGRATED CIRCUIT

FIELD OF THE DISCLOSURE

The present disclosure relates to integrated circuits, and more particularly, to gate cut structures.

BACKGROUND

As integrated circuits continue to scale downward in size, a number of challenges arise. For instance, reducing the size of memory and logic cells is becoming increasingly more difficult. Parasitic effects that can reduce transistor switching speed or otherwise degrade performance are common as structures become smaller and more densely packed. Due to the high complexity of integrated circuit layouts, such issues often go uncorrected which can have undesirable consequences to the operation of the integrated circuit. Accordingly, there remain a number of non-trivial challenges with respect to forming such high-density semiconductor devices.

Figure 1A:
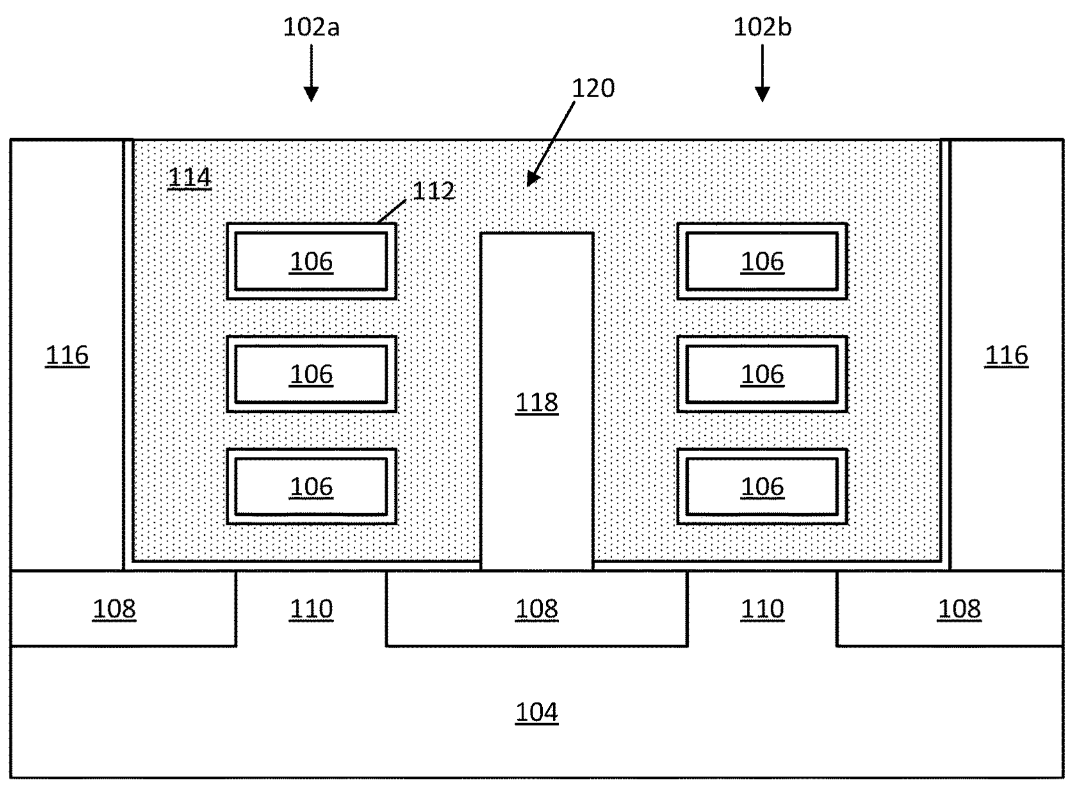
FIG. 1A is a cross-sectional view and FIG. 1B is a plan view of an integrated circuit including a partial gate cut structure between adjacent devices, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., some features may have tapered sidewalls and/or rounded corners), and some features may have surface topology or otherwise be non-smooth, given real world limitations of the processing equipment and techniques used.

DETAILED DESCRIPTION

Techniques are provided herein to form an integrated circuit having any number of partial gate cut structures between adjacent semiconductor devices. The techniques can be used in any number of integrated circuit applications and are particularly useful with respect to logic and memory cells, such as those cells that use finFETs or gate-all-around transistors (e.g., ribbonFETs and nanowire FETs). In an example, neighboring semiconductor devices each include a semiconductor region extending between a source region and a drain region, and a gate structure extending over the semiconductor regions of the neighboring semiconductor devices. In some such examples, a partial gate cut structure is present between a given pair of neighboring semiconductor devices. The partial gate cut structure acts as a dielectric pillar between the semiconductor structures that allows the conductive gate layer (from the gate structure) to extend above or below it such that the gates of each of the semiconductor devices remain electrically coupled together.

The gate cut structure itself removes a portion of the gate layer from between the semiconductor devices, thus reducing parasitic capacitance. Numerous variations and embodiments will be apparent in light of this disclosure.

General Overview

As previously noted above, there remain a number of non-trivial challenges with respect to integrated circuit fabrication. In more detail, the presence of any conductive structures, such as metal gate structures, can create parasitic capacitance between or among the devices. This undesirable capacitance can, for example, reduce switching speeds of the transistors or cause other delays in signal transmission throughout the integrated circuit. Certain regions of the gate structures may be "dead" regions where a relatively large amount of conductive material is used due to limitations in the fabrication process. As will be appreciated in light of this disclosure, these dead regions contribute to parasitic capacitance and can be removed to reduce such parasitic effects.

Thus, and in accordance with an embodiment of the present disclosure, techniques are provided herein to form partial gate cut structures that can remove portions of the gate structure between semiconductor devices, but still allow for a shared gate connection between those semiconductor devices. According to some such examples, forming a partial gate cut structure removes part of the gate structure without fully interrupting the gate structure. In some examples, a gate layer in the gate structure extends above the gate cut structure and/or below the gate cut structure to provide a conductive bridge or conduit between the gate structures over the adjacent semiconductor devices. In an embodiment, a partial gate cut structure is provided by etching away a portion of the gate structure and forming a dielectric pillar within the etched recess. The dielectric pillar may be recessed itself and a conductive material filled over it to provide a conductive bridge between the gate structures on either side of the partial gate cut structure. In some embodiments, the conductive bridge can be formed below the dielectric pillar or both above and below the dielectric pillar.

According to an embodiment, an integrated circuit includes a first semiconductor device having a first semiconductor region extending in a first direction between a first source region and a first drain region, and a second semiconductor device having a second semiconductor region extending in the first direction between a second source region and a second drain region. The second semiconductor device is spaced from the first semiconductor device in a second direction different from the first direction. The integrated circuit further includes a gate layer around each of the first semiconductor region and the second semiconductor region and a dielectric pillar between the first semiconductor device and the second semiconductor device, such that the gate layer extends over a top surface of the dielectric pillar or beneath a bottom surface of the dielectric pillar, or both over and beneath the dielectric pillar. In any such cases, the dielectric pillar acts as a partial gate cut structure.

According to another embodiment, an integrated circuit includes a gate layer extending in a first direction over one or more semiconductor regions of one or more corresponding semiconductor devices and a dielectric pillar adjacent to at least one of the one or more semiconductor devices and having sidewalls that contact the gate layer. The gate layer extends over a top surface of the dielectric pillar and/or beneath a bottom surface of the dielectric pillar. In any such cases, the dielectric pillar acts as a partial gate cut structure.

According to another embodiment, a method of forming an integrated circuit includes: forming a first fin comprising semiconductor material and a second fin comprising semiconductor material, the first and second fins extending above a substrate and each extending in a first direction; forming a gate layer extending over the first fin and the second fin in a second direction different from the first direction; forming a recess through the gate layer between the first fin and the second fin; forming a dielectric material within the recess; recessing the dielectric material within the recess; and forming a conductive material over the dielectric material, the conductive material being within the recess and coupled to the gate layer. In some such cases, the channel region is ribbonized during the gate forming process, in that alternate sacrificial layers of the fin are removed to release nanoribbons with the channel region, and the gate structure wraps arounds those nanoribbons. Other embodiments may include nanowires or nanosheets.

The techniques described herein can be used with any type of non-planar transistors, including finFETs (sometimes called double-gate transistors, or tri-gate transistors), or nanowire and nanoribbon transistors (sometimes called gate-all-around transistors), to name a few examples. The source and drain regions can be, for example, doped portions of a given fin or substrate, or epitaxial regions that are deposited during an etch-and-replace source/drain forming process. The dopant-type in the source and drain regions will depend on the polarity of the corresponding transistor. Any number of semiconductor materials can be used in forming the transistors, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate the presence of partial gate cut structures between any pair of semiconductor devices of a given integrated circuit. The partial gate cut structure could be a dielectric structure (e.g., a pillar) between adjacent semiconductor devices that interrupts or otherwise replaces only a portion of the gate structure extending across the semiconductor devices. In some examples, the conductive gate layer of the gate structure extends over the partial gate cut structure, under the partial gate cut structure, or both over and under the partial gate cut structure.

It should be readily understood that the meaning of "above" and "over" in the present disclosure should be interpreted in the broadest manner such that "above" and "over" not only mean "directly on" something but also include the meaning of over something with an intermediate feature or a layer therebetween. Further, spatially relative terms, such as "beneath," "below," "lower," "above," "upper," "top," "bottom," and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the material has an element that is not in the other material.

Architecture

FIG. 1A is a cross sectional view taken across a plurality of semiconductor devices 102*a* and 102*b*, according to an embodiment of the present disclosure. Each of semiconductor devices 102*a* and 102*b* may be non-planar metal oxide semiconductor (MOS) transistors, such as tri-gate or gate-all-around (GAA) transistors, although other transistor topologies and types could also benefit from the techniques provided herein. The examples herein illustrate semiconductor devices with a GAA structure (e.g., having nanoribbons that extend between source and drain regions).

As can be seen, semiconductor devices 102*a* and 102*b* are formed over a substrate 104. Any number of semiconductor devices can be formed on or over substrate 104, but two are used here as an example. Substrate 104 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, the substrate can be a semiconductor-on-insulator substrate having a desired semiconductor layer over a buried insulator layer (e.g., silicon over silicon dioxide). Alternatively, the substrate can be a multilayer substrate or superlattice suitable for forming nanowires or nanoribbons (e.g., alternating layers of silicon and SiGe, or alternating layers indium gallium arsenide and indium phosphide). Any number of substrates can be used. In some embodiments, substrate 104 is removed from the backside and replaced with one or more backside interconnect layers to provide backside power and signal routing.

Each of semiconductor devices 102*a* and 102*b* includes one or more nanoribbons 106 that extend parallel to one another along a direction between a source region and a drain region (e.g., into and out of the page in the cross-section view of FIG. 1A). Nanoribbons 106 are one example of semiconductor regions that extend between source and drain regions. The term nanoribbon may also encompass other similar shapes such as nanowires or nanosheets. The semiconductor material of nanoribbons 106 may be formed from substrate 104. In some embodiments, semiconductor devices 102*a* and 102*b* may each include semiconductor regions in the shape of fins that can be, for example, native to substrate 104 (formed from the substrate itself), such as silicon fins etched from a bulk silicon substrate. Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fins include alternating layers of material (e.g., alternating layers of silicon and SiGe) that facilitates forming of the illustrated nanoribbons 106 during a gate forming process where one type of the alternating layers are selectively etched away so as to liberate the other type of alternating layers within the channel region, so that a gate-all-around (GAA) process can then be carried out. Again, the alternating layers can be blanket deposited and then etched into fins or deposited into fin-shaped trenches.

As can further be seen, adjacent semiconductor devices are separated by a dielectric layer 108 that may include silicon oxide. Dielectric layer 108 provides shallow trench isolation (STI) between any adjacent semiconductor devices. Dielectric layer 108 can be any suitable dielectric material, such as silicon dioxide, aluminum oxide, or silicon oxycarbonitride.

Semiconductor devices 102*a* and 102*b* each include a subfin region 110. According to some embodiments, subfin region 110 comprises the same semiconductor material as substrate 104 and is adjacent to dielectric layer 108. According to some embodiments, nanoribbons 106 (or other semiconductor structures) are present above the top surface of subfin region 110 and provide an active region for each transistor (e.g., the semiconductor region beneath the gate).

As noted above, nanoribbons 106 extend between a source region and a drain region. The source and drain regions are not shown in the particular cross-section of FIG. 1A, but can be seen in FIG. 1B. According to some embodiments, the source and drain regions are epitaxial regions that are provided on the ends of the fins or nanoribbons in an etch-and-replace process. In other embodiments one or both of the source and drain regions could be, for example, implantation-doped native portions of the fins or substrate. Any semiconductor materials suitable for source and drain regions can be used (e.g., group IV and group III-V semiconductor materials). The source and drain regions may include multiple layers such as liners and capping layers to improve contact resistance. In any such cases, the composition and doping of the source and drain regions may be the same or different, depending on the polarity of the transistors. In an example, for instance, one transistor is a p-type MOS (PMOS) transistor, and the other transistor is an n-type MOS (NMOS) transistor. Any number of source and drain configurations and materials can be used.

According to some embodiments, a gate structure extends over nanoribbons 106 of semiconductor devices 102*a* and 102*b*. The gate structure includes a gate dielectric 112 and a gate layer 114. Gate dielectric 112 represents any number of dielectric layers present between nanoribbons 106 and gate layer 114. Gate dielectric 112 may also be present on the surfaces of other structures within the gate trench, such as on subfin region 110 or dielectric fill. Gate layer 114 may represent any number of conductive layers, such as any metal, metal alloy, or doped polysilicon layers. In some embodiments, gate layer 114 includes one or more workfunction metals around nanoribbons 106. In some embodiments, one of semiconductor devices 102*a* and 102*b* is a p-channel device that include a workfunction metal having titanium around its nanoribbons 106 and the other semiconductor device is an n-channel device that includes a workfunction metal having tungsten around its nanoribbons 106. Gate layer 114 may also include a fill metal or other conductive material around the workfunction metals to provide the whole gate electrode structure.

According to some embodiments, a given gate structure may be separated along the second direction by a different gate cut structure 116, which act like dielectric barriers between gate structures. The gate cut structures 116 effectively isolate different gate structures from one another along the second direction. In the illustrated example, two gate cut structures 116 are provided to form a gate structure for only semiconductor devices 102*a* and 102*b*. Gate cut structures 116 may be formed from a sufficiently insulating material, such as a dielectric material. Example materials for gate cut structures 116 include silicon nitride, silicon oxide, or silicon oxynitride. According to some embodiments, gate cut structures 116 each has a width between about 10 nm and about 15 nm.

According to some embodiments, a dielectric pillar 118 is provided between adjacent semiconductor devices 102*a* and 102*b*. Dielectric pillar 118 acts as a partial gate cut structure since gate layer 114 extends over dielectric pillar 118 at conductive bridge 120. In some examples, conductive bridge 120 includes the same conductive material as gate layer 114 such that no seam is visible between conductive bridge 120 and gate layer 114. In some other examples, a seam may be visible between conductive bridge 120 and gate layer 114, for example, in situations where different conductive materials are used.

Dielectric pillar 118 may be formed from a sufficiently insulating material, such as a dielectric material. In some embodiments, dielectric pillar 118 is formed from more than one dielectric layer. For example, a first dielectric layer may be present around the edges of dielectric pillar 118 while the center of dielectric pillar 118 is filled with a second dielectric layer different from the first dielectric layer. Example materials used for dielectric pillar 118 include silicon nitride, silicon oxide, or silicon oxynitride. According to some embodiments, dielectric pillar 118 has a width between about 10 nm and about 15 nm. According to some embodiments, gate dielectric 112 is not present along the sidewalls or top surface of dielectric pillar 118.

In the illustrated example, conductive bridge 120 is present over the top surface of dielectric pillar 118 to connect gate layer 114 across both semiconductor devices 102*a* and 102*b*. In some other examples, conductive bridge 120 is present beneath a bottom surface of dielectric pillar 118 to connect gate layer 114 across both semiconductor devices 102*a* and 102*b*. In yet other examples, conductive bridges are present above the top surface and beneath the bottom surface of dielectric pillar 118 to connect gate layer 114 across both semiconductor devices 102*a* and 102*b*.

Figure 1B:
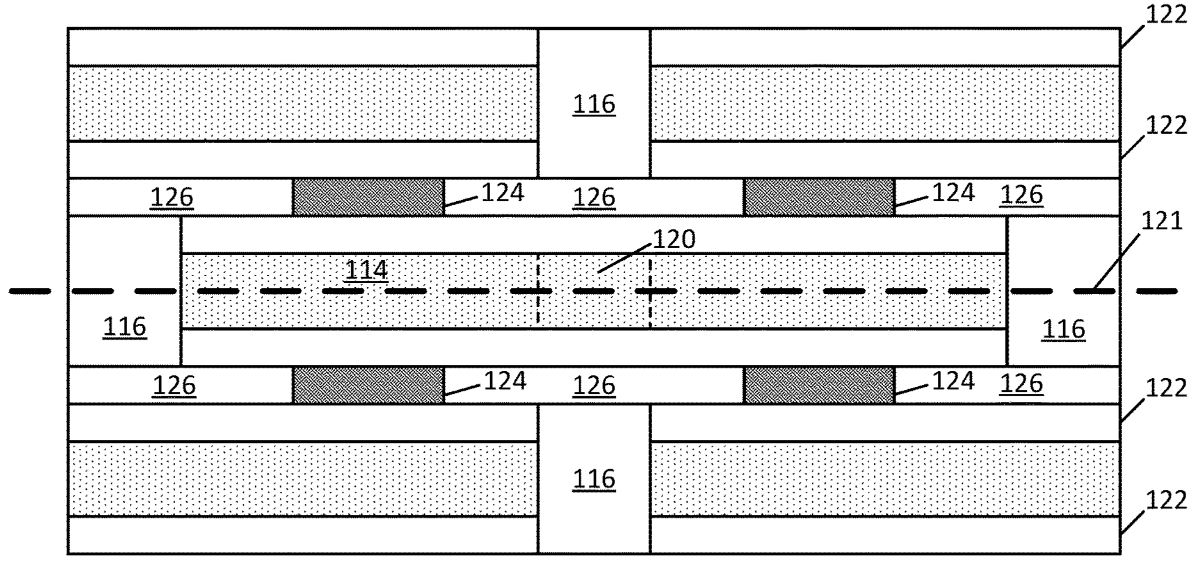

FIG. 1B illustrates a plan view of an integrated circuit that includes each of semiconductor devices 102*a* and 102*b*. The dashed line identifies a plane 121 through which the cross-section of FIG. 1A is taken. Spacer structures 122 are provided along sidewalls of the various gate structures and may include any suitable dielectric material, such as silicon nitride or silicon oxynitride. In some embodiments, gate dielectric 112 may be visible around one or more inside surfaces of spacer structures 122 and gate cut structures 116 (e.g., between spacer structures 122 and gate layer 114 and between gate cut structures 116 and gate layer 114) in the plan view of FIG. 1B.

The various semiconductor regions of the semiconductor devices extend between source or drain regions 124. Any of source or drain regions 124 may act as either a source region or a drain region, depending on the application and dopant profile. Any semiconductor materials suitable for source and drain regions can be used (e.g., group IV and group III-V semiconductor materials) for any of the illustrated source or drains regions 124. In any such cases, the composition and doping of source or drain regions 124 may be the same or different, depending on the polarity of the transistors. For example, p-type MOS (PMOS) transistors have a high concentration of p-type dopants in the associated source or drain regions 124, and n-type MOS (NMOS) transistors have a high concentration of n-type dopants in the associated source or drain regions 124. Any number of source and drain configurations and materials can be used. A dielectric fill 126 may be used between adjacent source or drain regions 124 to provide electrical isolation. In some embodiments, dielectric fill 126 also extends over a top of source or drain regions 124 within the source/drain trench. Contacts may be formed through dielectric fill 126 to land on top and/or side surfaces of source or drain regions 124.

Fabrication Methodology

FIGS. 2A-12A and 2B-12B are cross-sectional and plan views, respectively, that collectively illustrate an example process for forming an integrated circuit configured with partial gate cut structures, in accordance with an embodiment of the present disclosure. FIGS. 2A-12A represent a cross-sectional view taken across plane 121 shown in FIG. 1B, while FIGS. 2B-12B represent the corresponding plan view across a portion of the integrated circuit. Each figure shows an example structure that results from the process flow up to that point in time, so the depicted structure evolves as the process flow continues, culminating in the structure shown in FIGS. 12A and 12B, which is similar to the structure shown in FIGS. 1A and 1B. Such a structure may be part of an overall integrated circuit (e.g., such as a processor or memory chip) that includes, for example, digital logic cells and/or memory cells and analog mixed signal circuitry. Thus, the illustrated integrated circuit structure may be part of a larger integrated circuit that includes other integrated circuitry not depicted. Example materials and process parameters are given, but the present disclosure is not intended to be limited to any specific such materials or parameters, as will be appreciated. Figures sharing the same number (e.g., FIGS. 2A and 2B) illustrate different views of the structure at the same point in time during the process flow.

Figures 2A, 2B:
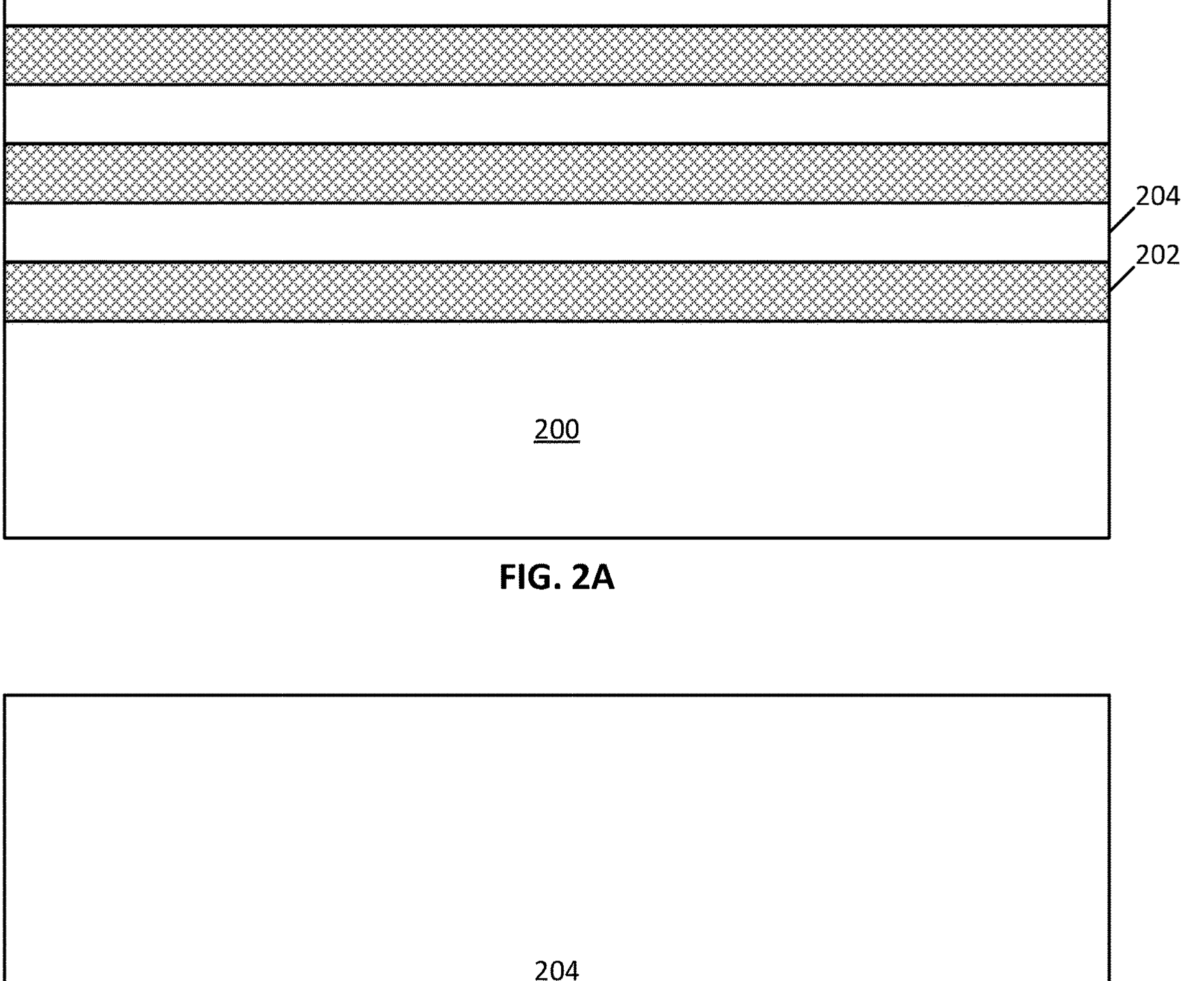
FIGS. 2A and 2B are cross-sectional and plan views, respectively, that illustrate one stage in an example process for forming an integrated circuit configured with a partial gate cut structure, in accordance with an embodiment of the present disclosure.

FIG. 2A illustrates a cross-sectional view taken through a substrate 200 having a series of material layers formed over the substrate, according to an embodiment of the present disclosure. Alternating material layers may be deposited over substrate 200 including sacrificial layers 202 alternating with semiconductor layers 204. The alternating layers are used to form GAA transistor structures. Any number of alternating semiconductor layers 204 and sacrificial layers 202 may be deposited over substrate 200. The description above for substrate 104 applies equally to substrate 200.

According to some embodiments, sacrificial layers 202 have a different material composition than semiconductor layers 204. In some embodiments, sacrificial layers 202 are silicon germanium (SiGe) while semiconductor layers 204 include a semiconductor material suitable for use as a nanoribbon such as silicon (Si), SiGe, germanium, or III-V materials like indium phosphide (InP) or gallium arsenide (GaAs). In examples where SiGe is used in each of sacrificial layers 202 and in semiconductor layers 204, the germanium concentration is different between sacrificial layers 202 and semiconductor layers 204. For example, sacrificial layers 202 may include a higher germanium content compared to semiconductor layers 204. In some examples, semiconductor layers 204 may be doped with either n-type dopants (to produce a p-channel transistor) or p-type dopants (to produce an n-channel transistor).

While dimensions can vary from one example embodiment to the next, the thickness of each sacrificial layer 202 may be between about 5 nm and about 20 nm. In some embodiments, the thickness of each sacrificial layer 202 is substantially the same (e.g., within 1-2 nm). The thickness of each of semiconductor layers 204 may be about the same as the thickness of each sacrificial layer 202 (e.g., about 5-20 nm). Each of sacrificial layers 202 and semiconductor layers 204 may be deposited using any known material deposition technique, such as chemical vapor deposition (CVD), plasma-enhanced chemical vapor deposition (PECVD), physical vapor deposition (PVD), or atomic layer deposition (ALD). FIG. 2B illustrates a plan view showing only the top-most deposited semiconductor layer 204, according to an embodiment.

Figure 3A:
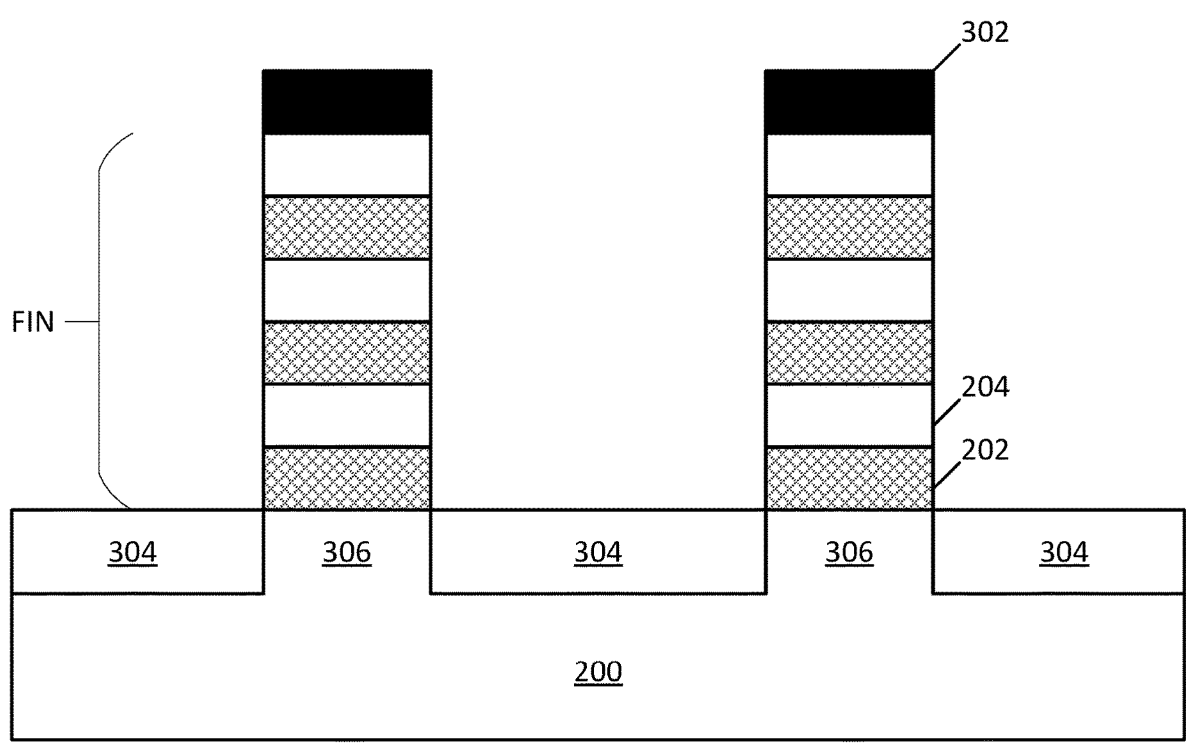
FIGS. 3A and 3B are cross-sectional and plan views, respectively, that illustrate another stage in the example process for forming an integrated circuit configured with a partial gate cut structure, in accordance with an embodiment of the present disclosure.
Figure 3B:
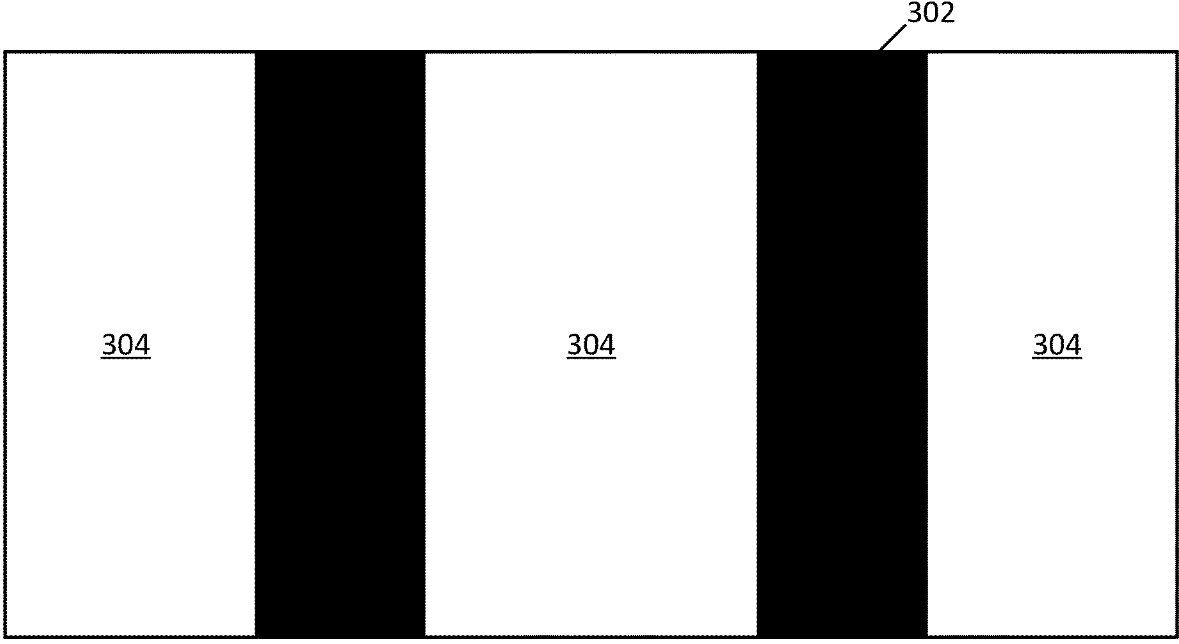

FIGS. 3A and 3B depict the cross-section and plan views of the structure shown in FIGS. 2A and 2B, respectively, following the formation of a cap layer 302 and the subsequent formation of fins beneath cap layer 302, according to an embodiment. Cap layer 302 may be any suitable hard mask material such as a carbon hard mask (CHM) or silicon nitride. Cap layer 302 is patterned into rows to form corresponding rows of fins from the alternating layer stack of sacrificial layers 202 and semiconductor layers 204.

According to some embodiments, an anisotropic etching process through the layer stack continues into at least a portion of substrate 200. The etched portion of substrate 200 may be filled with a dielectric layer 304 that acts as shallow trench isolation (STI) between adjacent fins. Dielectric layer 304 may be any suitable dielectric material such as silicon oxide. Subfin regions 306 represent remaining portions of substrate 200 between dielectric layer 304, according to some embodiments. FIG. 3B illustrates how dielectric layer 304 extends along the entire length of each of the fins, according to some embodiments.

Figure 4A:
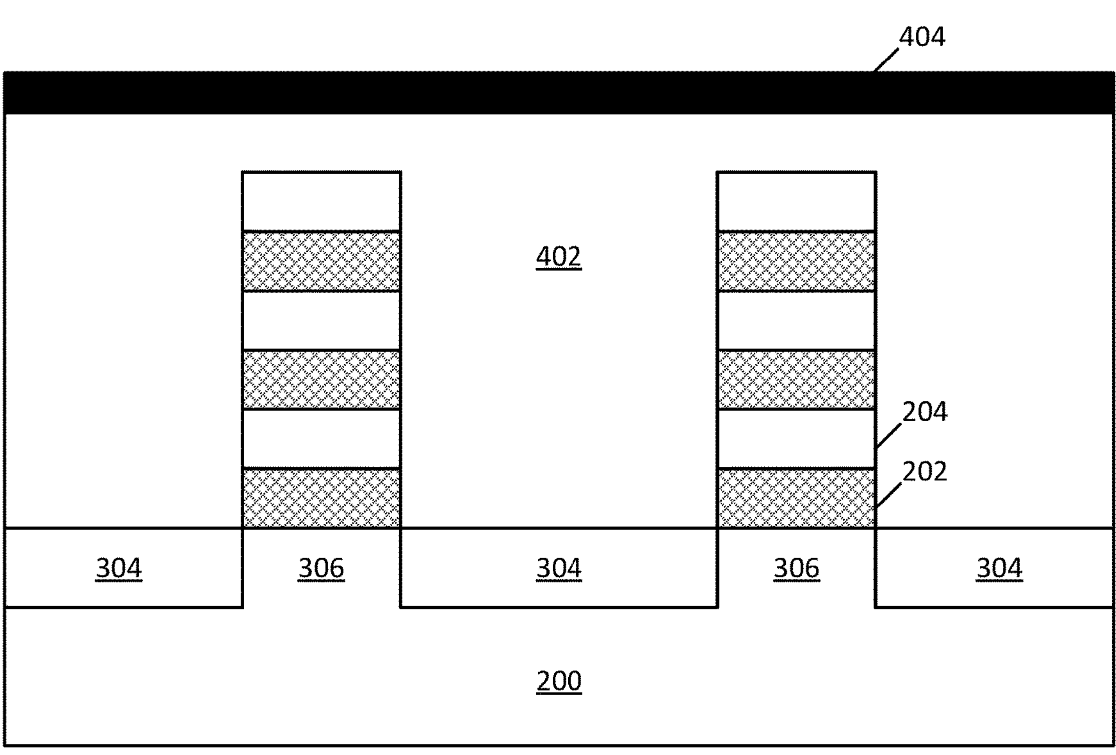
FIGS. 4A and 4B are cross-sectional and plan views, respectively, that illustrate another stage in the example process for forming an integrated circuit configured with a partial gate cut structure, in accordance with an embodiment of the present disclosure.
Figure 4B:
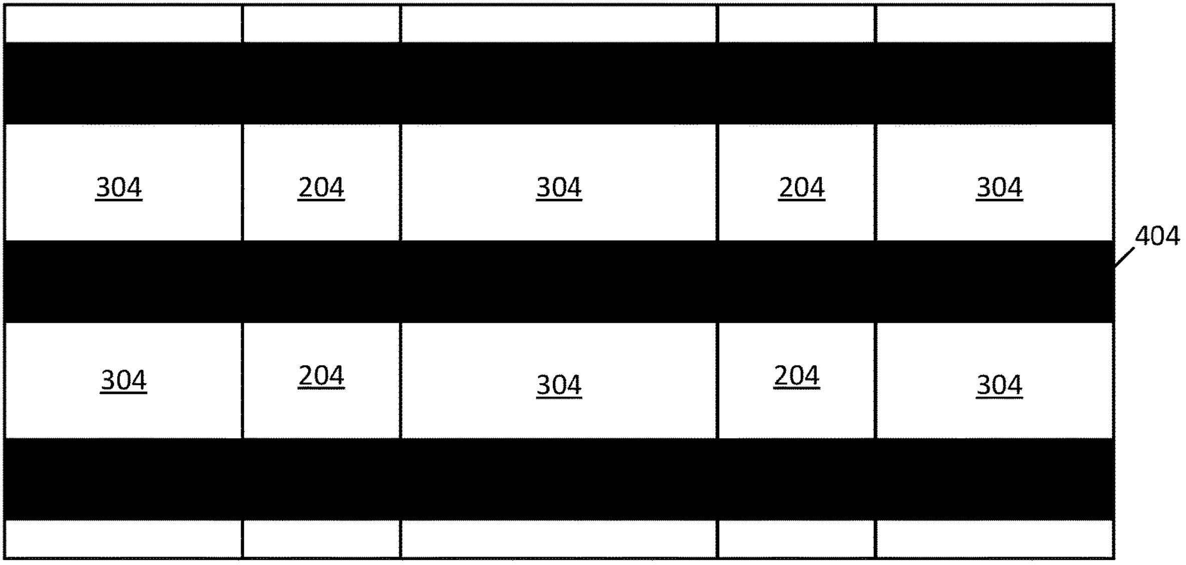

FIGS. 4A and 4B depict the cross-section and plan views of the structure shown in FIGS. 3A and 3B, respectively, following the formation of a sacrificial gate 402 beneath a corresponding gate masking layer 404, according to some embodiments. Gate masking layers 404 may be patterned in strips that extend orthogonally across each of the fins in order to form corresponding sacrificial gates 402 in strips beneath the gate masking layers 404. According to some embodiments, the sacrificial gate material is removed in all areas not protected by gate masking layers 404. Gate masking layer 404 may be any suitable hard mask material such as CHM or silicon nitride. Sacrificial gate 402 may be any suitable material that can be selectively removed without damaging the semiconductor material of the fins. In some examples, sacrificial gate 402 includes polysilicon.

Figure 5A:
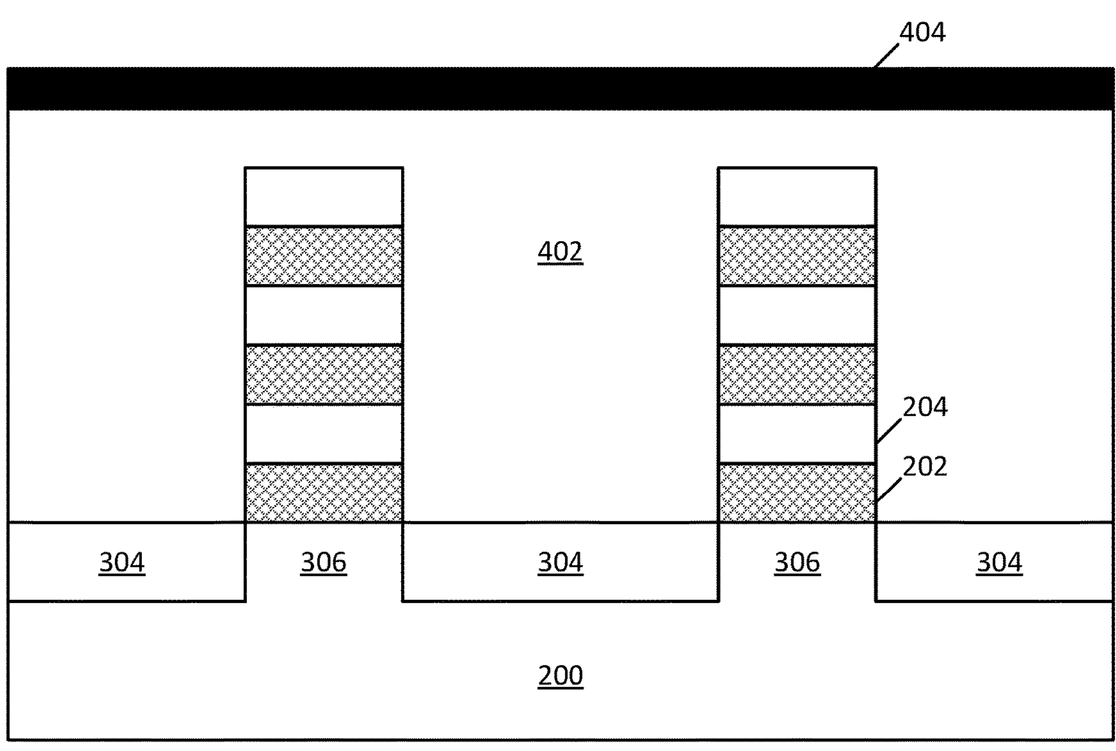
FIGS. 5A and 5B are cross-sectional and plan views, respectively, that illustrate another stage in the example process for forming an integrated circuit configured with a partial gate cut structure, in accordance with an embodiment of the present disclosure.
Figure 5B:
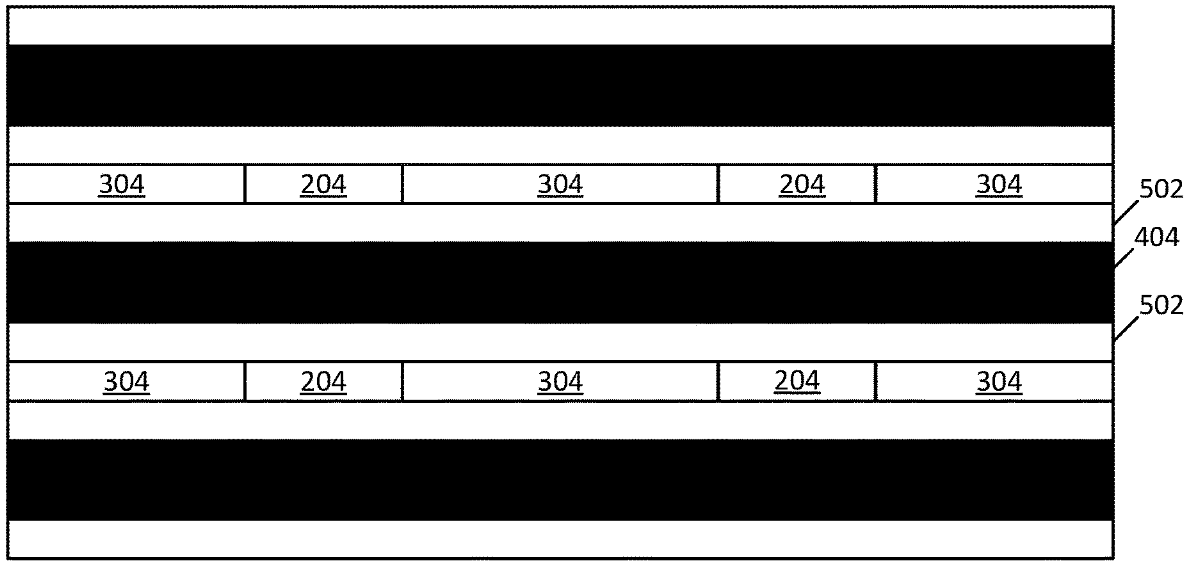

FIGS. 5A and 5B depict the cross-section and plan views of the structure shown in FIGS. 4A and 4B, respectively, following the formation of spacer structures 502, according to some embodiments. Spacer structures 502 may be formed along the sidewalls of sacrificial gates 402 and gate masking layers 404. In some other embodiments, gate masking layers 404 are first removed such that spacer structures 502 are formed along the sidewalls of sacrificial gates 402. Spacer structures 502 may be deposited and then etched back such that spacer structures 502 remain mostly only on sidewalls of any exposed structures. In the plan view of FIG. 5B, spacer structures 502 may also be formed along sidewalls of the exposed fins (having a top semiconductor layer 204) over dielectric layer 304. Such sidewall spacers on the fins can be removed during later processing when forming the source or drain regions. According to some embodiments, spacer structures 502 may be any suitable dielectric material, such as silicon nitride, silicon carbon nitride, or silicon oxycarbonitride. In one such embodiment, spacer structures 502 comprise a nitride and dielectric layer 304 comprises an oxide, so as to provide a degree of etch selectivity during final gate processing. Other etch selective dielectric schemes (e.g., oxide/carbide, carbide/nitride) can be used as well for spacer structures 502 and dielectric layer 304. In other embodiments, spacer structures 502 and dielectric layer 304 are compositionally the same or otherwise similar, where etch selectivity is not employed.

Figure 6A:
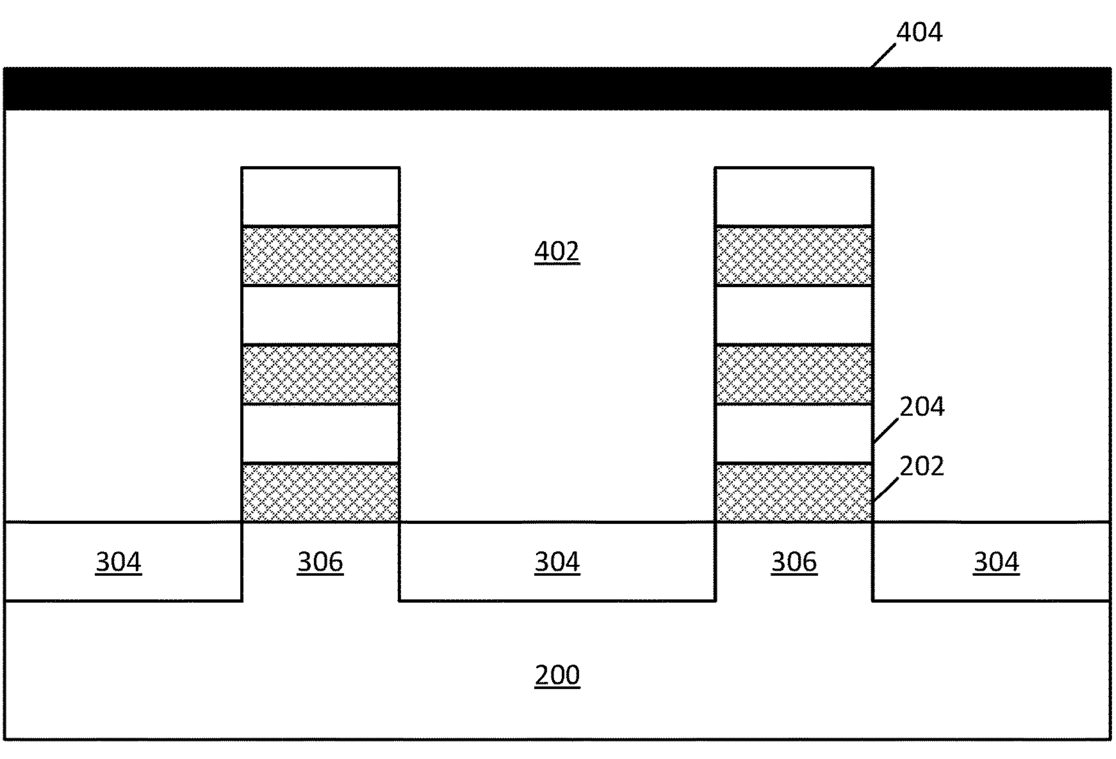
FIGS. 6A and 6B are cross-sectional and plan views, respectively, that illustrate another stage in the example process for forming an integrated circuit configured with a partial gate cut structure, in accordance with an embodiment of the present disclosure.
Figure 6B:

FIGS. 6A and 6B depict the cross-section and plan views of the structure shown in FIGS. 5A and 5B, respectively, following the formation of source or drain regions 602, according to some embodiments. In more detail, and according to an example, exposed portions of the fins between spacer structures 502 are removed. The exposed fin portions may be removed using any anisotropic etching process, such as reactive ion etching (RIE). Once the exposed fins have been removed, source or drain regions 602 may be formed in the areas that had been previously occupied by the exposed fins between spacer structures 502. According to some embodiments, source or drain regions 602 are epitaxially grown from the exposed semiconductor material of the fins (or nanoribbons, nanowires or nanosheets, as the case may be) along the exterior walls of spacer structures 502. In some example embodiments, source or drain regions 602 are NMOS source or drain regions (e.g., epitaxial silicon) or PMOS source or drain regions (e.g., epitaxial SiGe).

According to some embodiments, a dielectric fill 604 is provided between adjacent source or drain regions 602. Dielectric fill 604 may be any suitable dielectric material, such as silicon oxide. In some examples, dielectric fill 604 also extends over a top surface of source or drain regions 602 (e.g., up to and planar with a top surface of spacer structures 502). One or more conductive contacts may be formed at a later time through dielectric fill 604 to provide electrical contact to source or drain regions 602. For the remaining figures, dielectric fill 604 is only illustrated adjacent to source or drain regions 602 so that they are visible in the plan view.

Figure 7A:
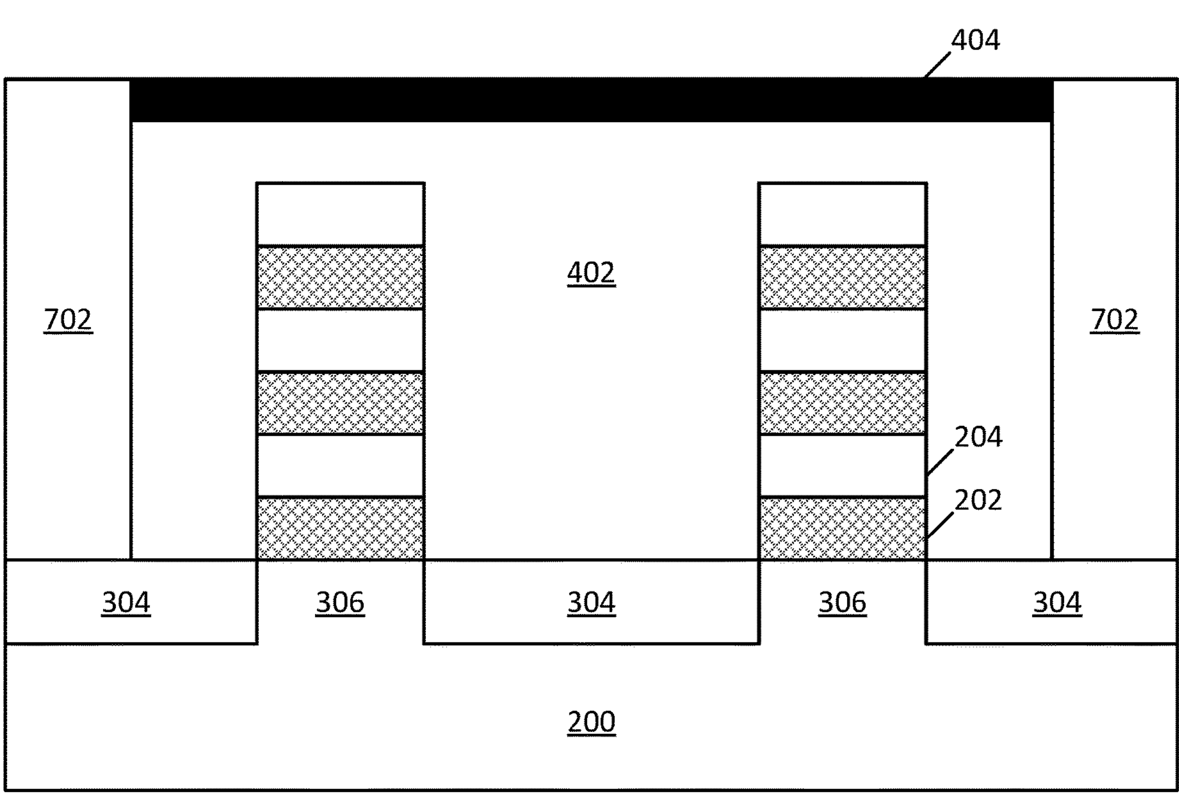
FIGS. 7A and 7B are cross-sectional and plan views, respectively, that illustrate another stage in the example process for forming an integrated circuit configured with a partial gate cut structure, in accordance with an embodiment of the present disclosure.
Figure 7B:
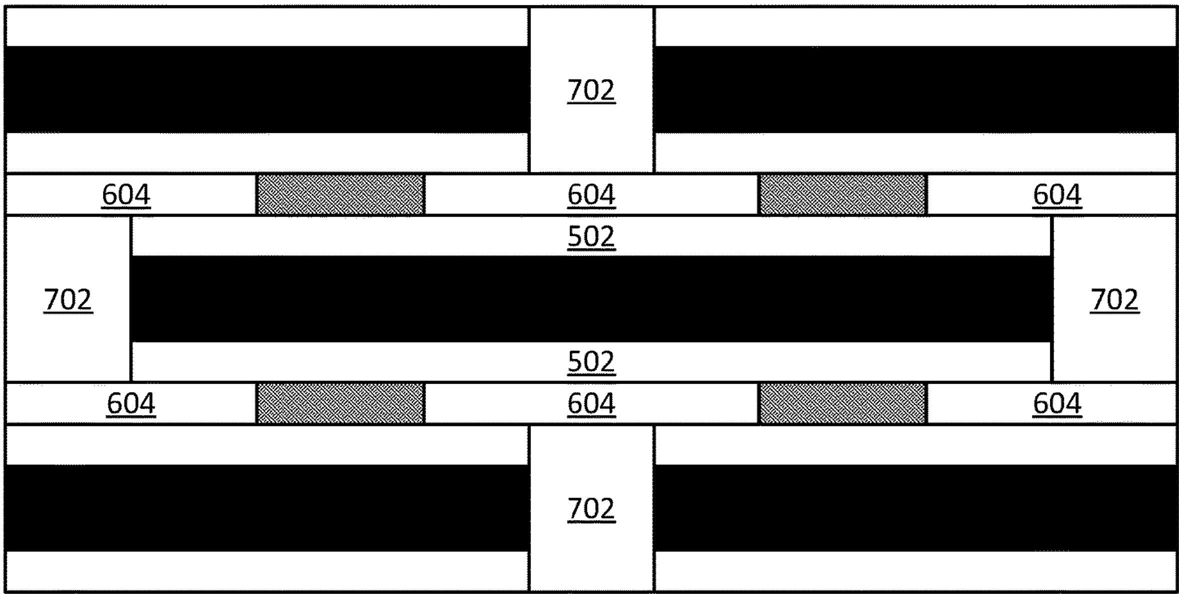

FIGS. 7A and 7B depict the cross-section and plan views of the structure shown in FIGS. 6A and 6B, respectively, following the formation of gate cut structures 702, according to some embodiments. A portion of sacrificial gate 402 is removed using an anisotropic etching process to form a given recess for a corresponding gate cut structure 702. In some embodiments, the recess is formed through an entire thickness of sacrificial gate 402, such that the recess extends to a top surface of dielectric layer 304 or into a portion of dielectric layer 304. According to some embodiments, the recess is also etched through at least a portion of the adjacent spacer structures 502 as seen in FIG. 7B. Any such formed recesses may then be filled with one or more dielectric layers to form gate cut structures 702. Gate cut structures 702 may include any suitable dielectric material, such as silicon nitride, silicon oxide, or silicon oxynitride. In some embodiments, a top surface of gate cut structures 702 is polished using, for example, chemical mechanical polishing (CMP) to planarize the top surface of gate cut structures 702 with a top surface of at least spacer structures 502.

Figure 8A:
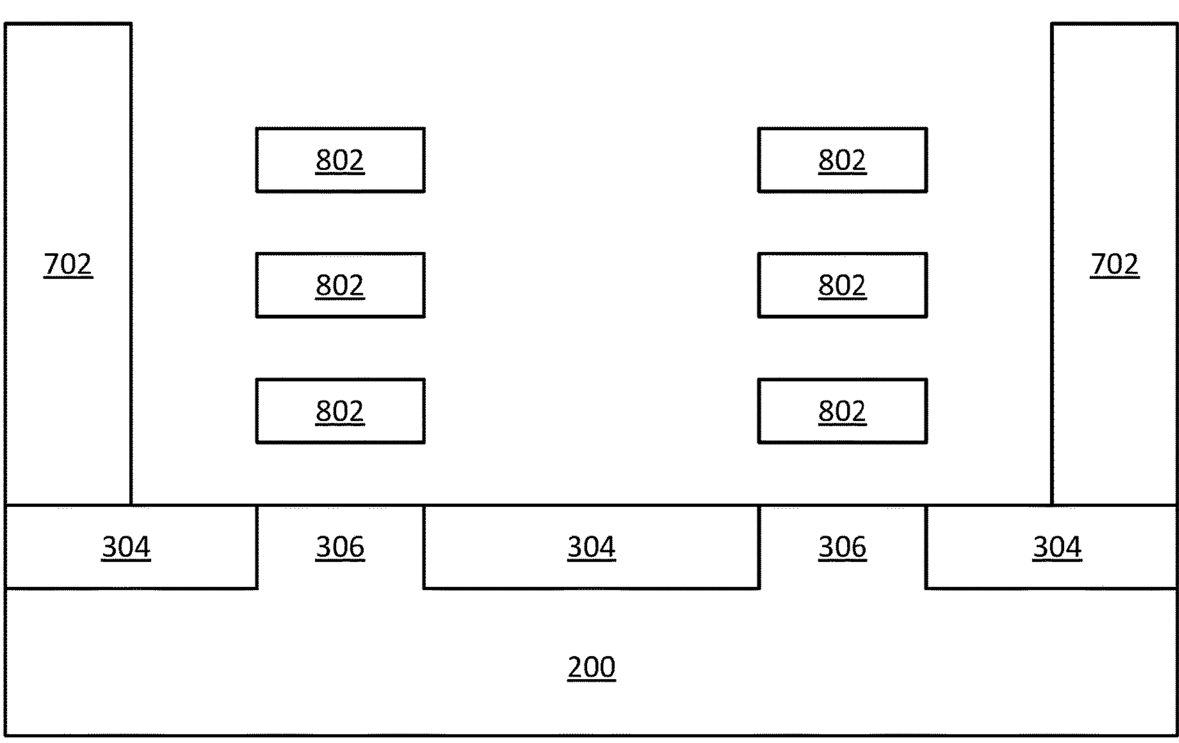
FIGS. 8A and 8B are cross-sectional and plan views, respectively, that illustrate another stage in the example process for forming an integrated circuit configured with a partial gate cut structure, in accordance with an embodiment of the present disclosure.
Figure 8B:
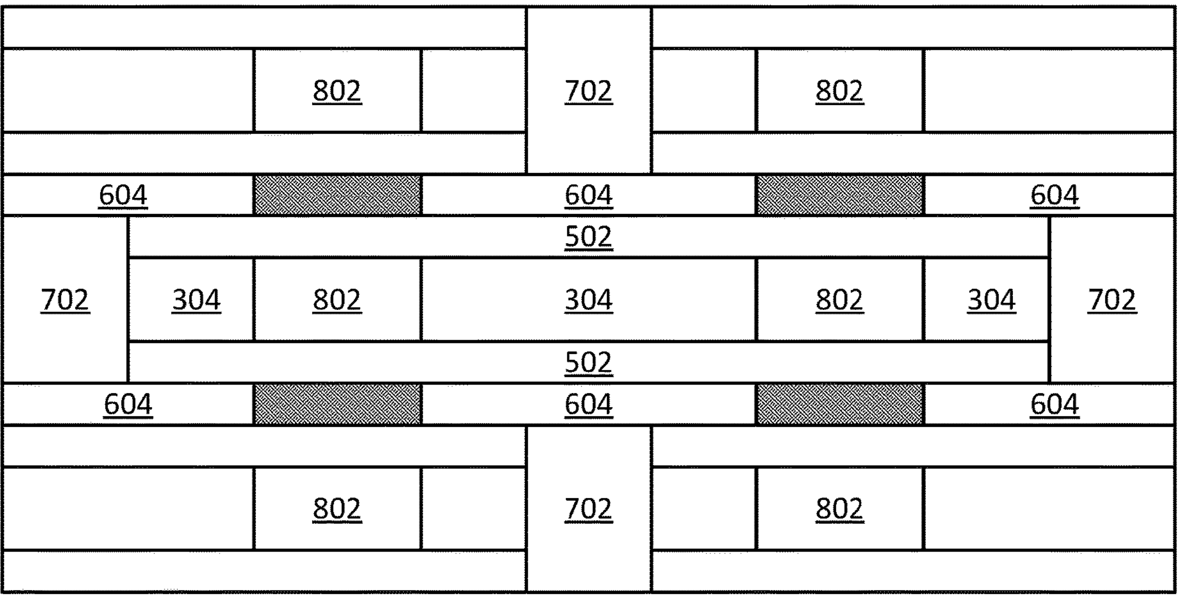

FIGS. 8A and 8B depict the cross-section and plan views of the structure shown in FIGS. 7A and 7B, respectively, following the removal of sacrificial gates 402 and sacrificial layers 202, according to some embodiments. In examples where gate masking layers 404 are still present, they would also be removed at this time. Once sacrificial gates 402 are removed, the fins extending between spacer structures 502 are exposed.

In the example where the fins include alternating semiconductor layers, sacrificial layers 202 are selectively removed to release nanoribbons 802 that extend between corresponding source or drain regions 602. Each vertical set of nanoribbons 802 represents the semiconductor region of a different semiconductor device. It should be understood that nanoribbons 802 may also be nanowires or nanosheets. Gate cut structures 702 remain following the removal of sacrificial gates 402. Sacrificial gates 402 and sacrificial layers 202 may be removed using the same isotropic etching process or different isotropic etching processes.

Figure 9A:
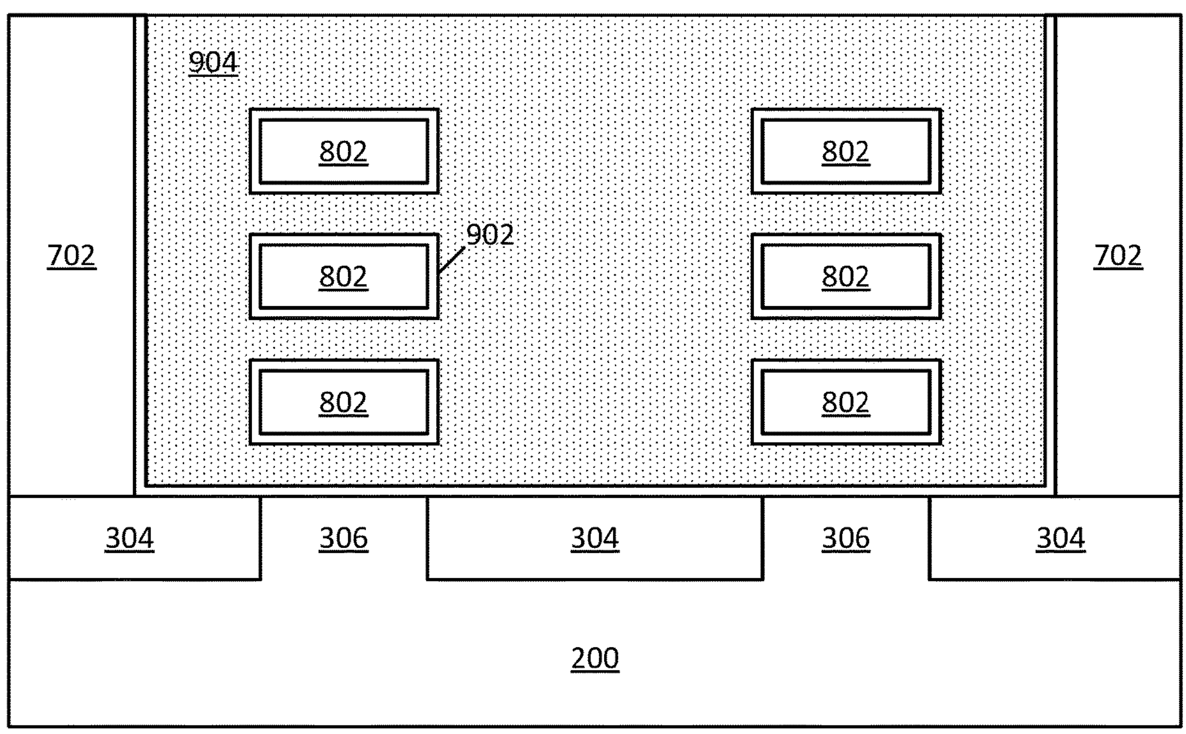
FIGS. 9A and 9B are cross-sectional and plan views, respectively, that illustrate another stage in the example process for forming an integrated circuit configured with a partial gate cut structure, in accordance with an embodiment of the present disclosure.
Figure 9B:
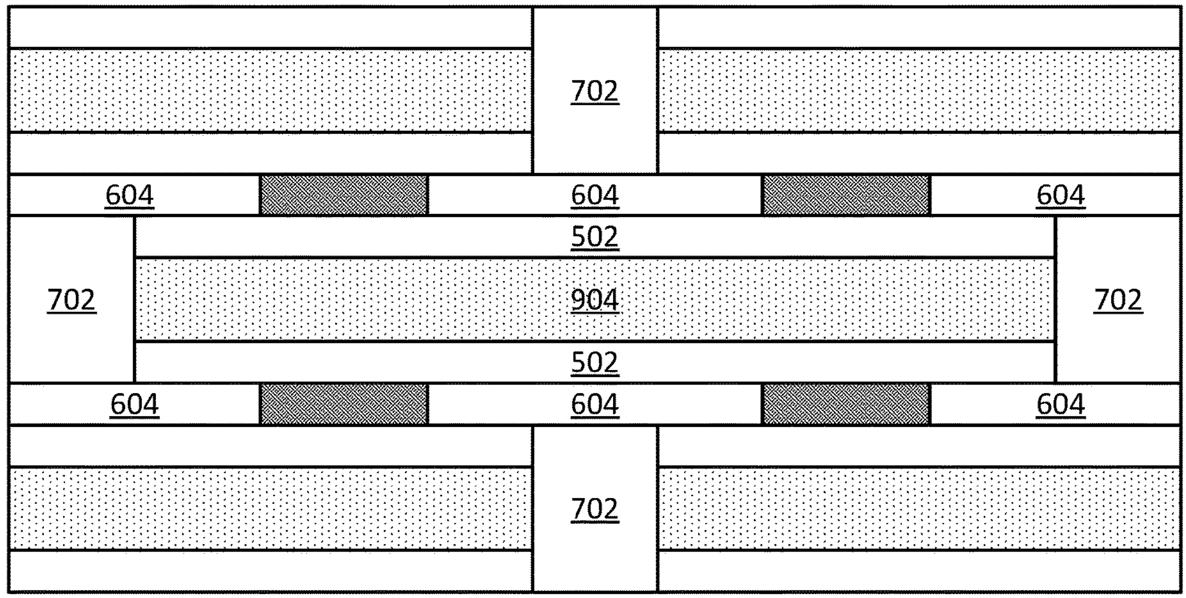

FIGS. 9A and 9B depict the cross-section and plan views of the structure shown in FIGS. 8A and 8B, respectively, following the formation of gate structures and subsequent polishing, according to some embodiments. Each gate structure includes a gate dielectric 902 and a conductive gate layer 904. Gate dielectric 902 may be first formed around nanoribbons 802 prior to the formation of gate layer 904. The gate dielectric 902 may include any suitable dielectric material (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. According to some embodiments, gate dielectric 902 includes a layer of hafnium oxide with a thickness between about 1 nm and about 5 nm. In some embodiments, gate dielectric 902-1 may include one or more silicates (e.g., titanium silicate, tungsten silicate, niobium silicate, and silicates of other transition metals). In some cases, gate dielectric 902 may include a first layer on nanoribbons 802, and a second layer on the first layer. The first layer can be, for instance, an oxide of the semiconductor material of nanoribbons 802 (e.g., silicon dioxide) and the second layer can be a high-k dielectric material (e.g., hafnium oxide). According to some embodiments, gate dielectric 902 forms along all surfaces exposed within the gate trench between spacer structures 502, such as on the top surfaces of dielectric layer 304 and subfin regions 306, and along inner sidewalls of spacer structures 502 (including along sides of gate cut structures 702).

As noted above, gate layer 904 can represent any number of conductive layers. The conductive gate layer 904 may be deposited using electroplating, electroless plating, CVD, PECVD, ALD, or PVD, to name a few examples. In some embodiments, gate layer 904 includes doped polysilicon, a metal, or a metal alloy. Example suitable metals or metal alloys include aluminum, tungsten, cobalt, molybdenum, ruthenium, titanium, tantalum, copper, and carbides and nitrides thereof. Gate layer 904 may include, for instance, a metal fill material along with one or more workfunction layers, resistance-reducing layers, and/or barrier layers. The workfunction layers can include, for example, p-type workfunction materials (e.g., titanium nitride) for PMOS gates, or n-type workfunction materials (e.g., titanium aluminum carbide) for NMOS gates. Following the formation of the gate structures, the entire structure may be polished such that the top surface of any given gate structure is planar with the top surface of at least spacer structures 502.

Figure 10A:
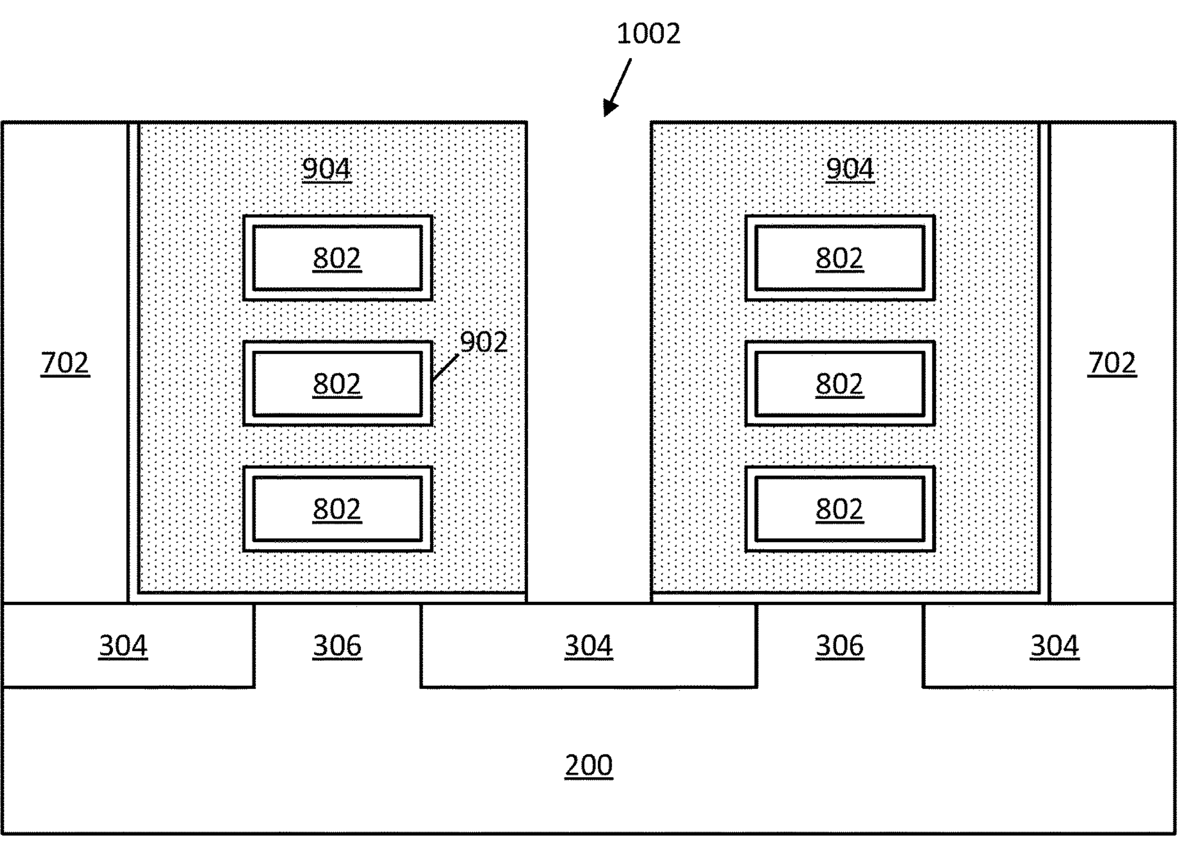
FIGS. 10A and 10B are cross-sectional and plan views, respectively, that illustrate another stage in the example process for forming an integrated circuit configured with a partial gate cut structure, in accordance with an embodiment of the present disclosure.
Figure 10B:
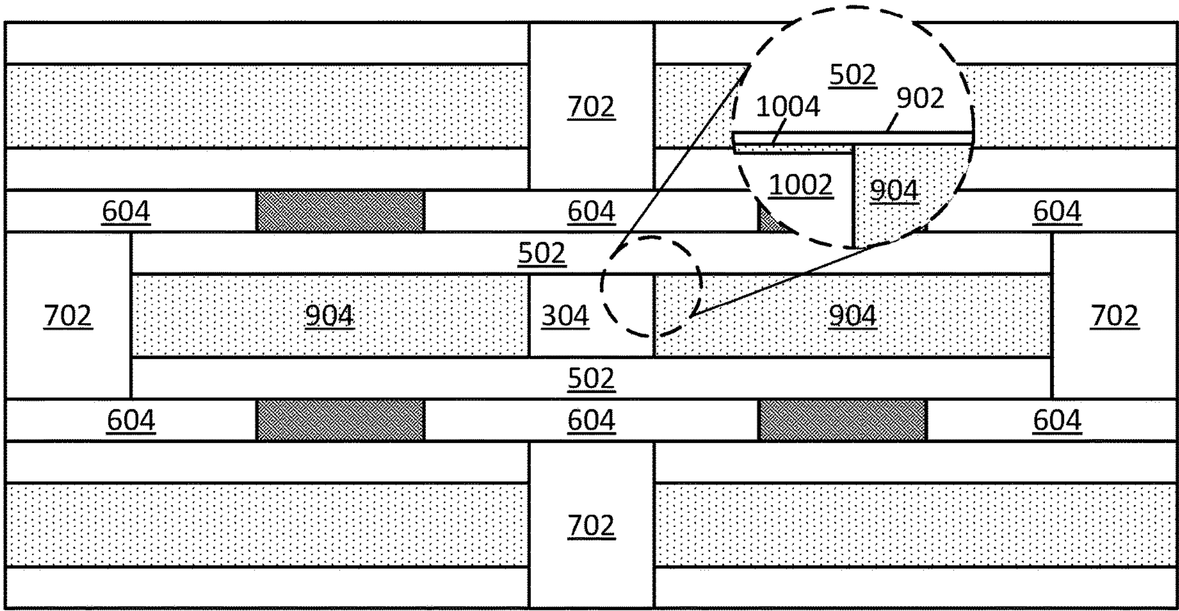

FIGS. 10A and 10B depict the cross-section and plan views of the structure shown in FIGS. 9A and 9B, respectively, following the formation of a recess 1002 through at least gate layer 904. Recess 1002 may be formed using an anisotropic etching process through gate layer 904. In some embodiments, recess 1002 extends through gate dielectric 902 until dielectric layer 304 is reached. In some embodiments, recess 1002 stops at a top surface of gate dielectric 902. In some examples, recess 1002 extends in the first direction through a portion of spacer structures 502.

Removing all traces of gate layer 904 from recess 1002 can be difficult, especially along the inner sidewalls of spacer structures 502. Thus, according to some embodiments, a remnant layer or portion 1004 of gate layer 904 could remain along the inner sidewalls of spacer structures 502 (or along gate dielectric 902 on the sidewalls of spacer structures 502) within recess 1002. Remnant layer 1004 may be discontinuous on the sidewall depending on the etching process used to form recess 1002, but nonetheless may still be detectable when present.

Figure 11A:
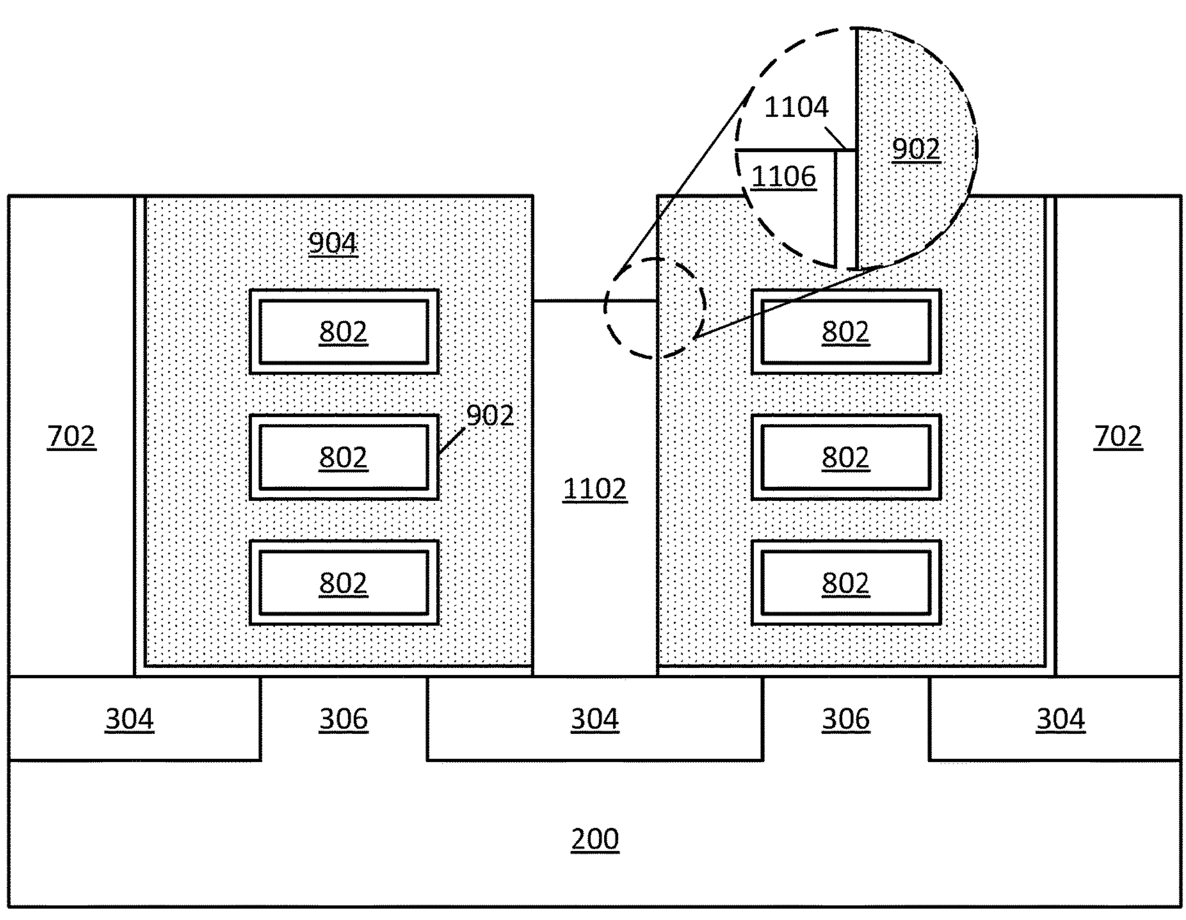
FIGS. 11A and 11B are cross-sectional and plan views, respectively, that illustrate another stage in the example process for forming an integrated circuit configured with a partial gate cut structure, in accordance with an embodiment of the present disclosure.
Figure 11B:
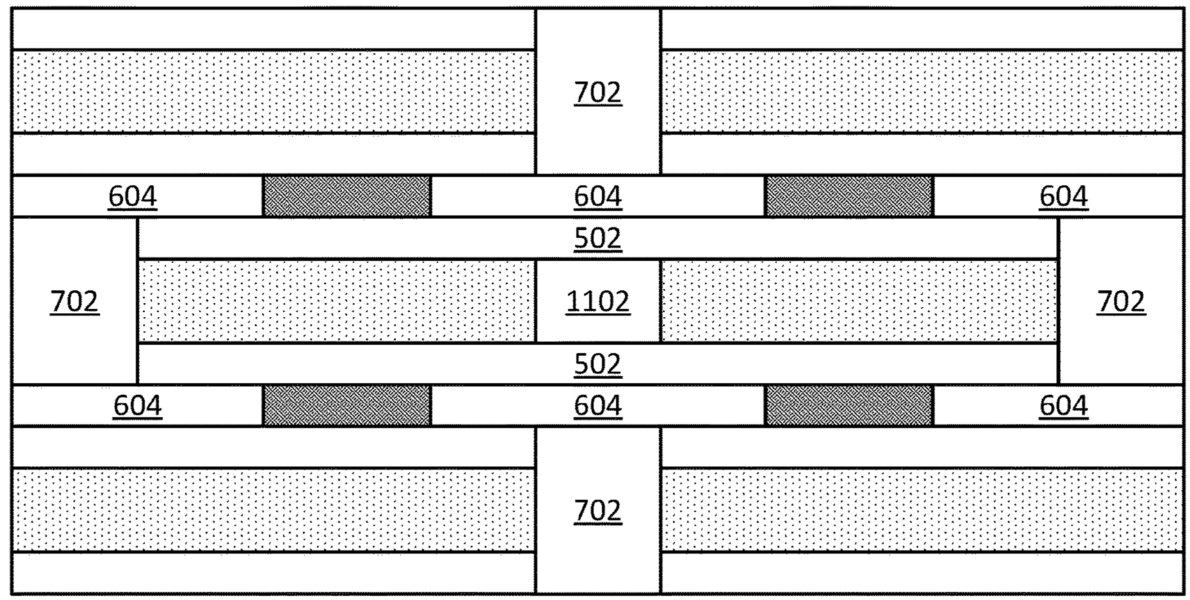

FIGS. 11A and 11B depict the cross-section and plan views of the structure shown in FIGS. 10A and 10B, respectively, following the formation of a dielectric pillar 1102 within recess 1002. Dielectric pillar 1102 may include any number of dielectric layers that are deposited using any conventional deposition technique. According to some embodiments, dielectric pillar 1102 is initially formed within the entirety of recess 1002 and polished to have a planar top surface along with the surrounding gate layer 904. Afterwards, an isotropic etching process may be performed to recess dielectric pillar 1102, such that a top surface of dielectric pillar 1102 is below a top surface of gate layer 904. The recessed distance may vary between different applications, but in some embodiments, the recessed distance is between about 5 nm and about 20 nm. In some embodiments, the top surface of dielectric pillar 1102 is at least level with or above a top surface of the topmost nanoribbon 802 (or the top surface of any semiconductor region from the adjacent devices).

Dielectric pillar 1102 can include any suitable dielectric material, such as silicon oxide, silicon nitride, or silicon oxynitride. In some embodiments, dielectric pillar 1102 is formed by depositing a first dielectric layer 1104 that conformally deposits along the inner surfaces of recess 1002 (e.g., side surfaces and bottom surface), followed by depositing a second dielectric fill 1106 within a remaining portion of recess 1002. Second dielectric fill 1106 may include, for example, a low-K dielectric material (e.g., porous silicon dioxide). In some embodiments, first dielectric layer 1104 includes silicon nitride while second dielectric fill 1106 includes silicon oxide.

Figure 12A:
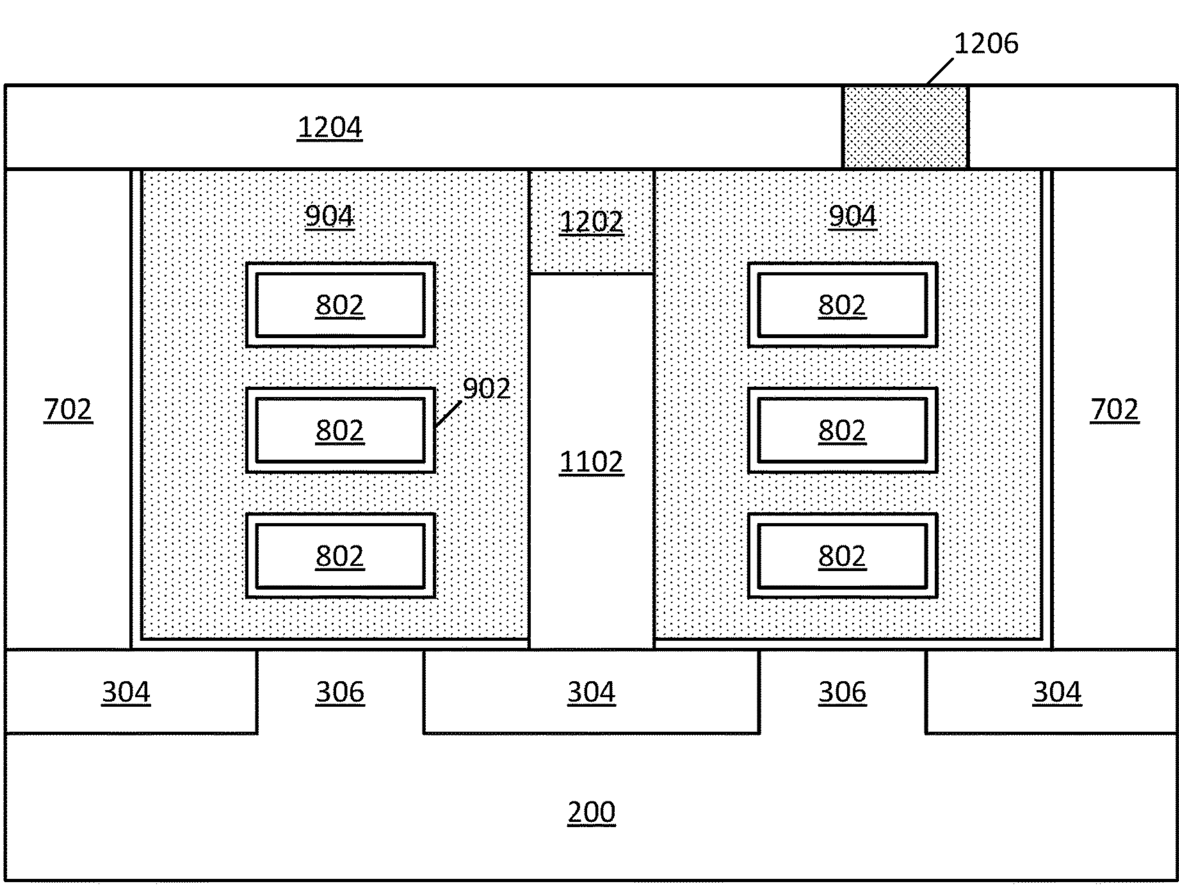
FIGS. 12A and 12B are cross-sectional and plan views, respectively, that illustrate another stage in the example process for forming an integrated circuit configured with a partial gate cut structure, in accordance with an embodiment of the present disclosure.
Figure 12B:
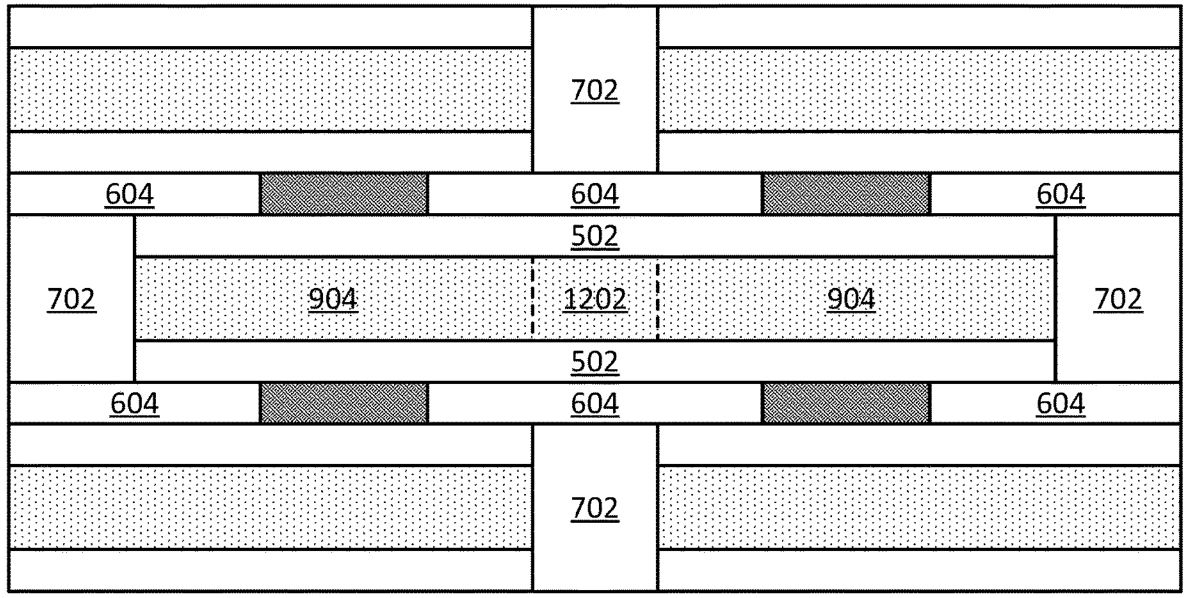

FIGS. 12A and 12B depict the cross-section and plan views of the structure shown in FIGS. 11A and 11B, respectively, following the formation of conductive bridge 1202 over dielectric pillar 1102. Conductive bridge 1202 may include the same conductive material as the conductive fill used in gate layer 904 (or any other conductive material used in gate layer 904). Accordingly, in some embodiments, no seam may be visible between conductive bridge 1202 and gate layer 904 across the adjacent semiconductor devices. In other embodiments, a different conductive material may be used for conductive bridge 1202, thus forming a noticeable (e.g., in a TEM or SEM image) seam between conductive bridge 1202 and gate layer 904.

The resulting dielectric pillar 1102 acts as a partial gate cut structure as it interrupts only a portion of gate layer 904 within the gate trench. In some examples, dielectric pillar 1102 may be made wider (in the second direction) to remove more unnecessary metal from between the adjacent semiconductor devices. According to some embodiments, gate dielectric 902 is not present along either sidewall or the top surface of dielectric pillar 1102, as it is formed after the formation of the gate structure.

According to some embodiments, an interlayer dielectric (ILD) 1204 may be provided over the gate structure and a topside contact 1206 can be formed through ILD 1204 to land on at least a portion of gate layer 904. Topside contact 1206 may be any suitable conductive material, such as tungsten. In some embodiments, topside contact 1206 also lands on at least a portion of conductive bridge 1202.

Figure 12C:
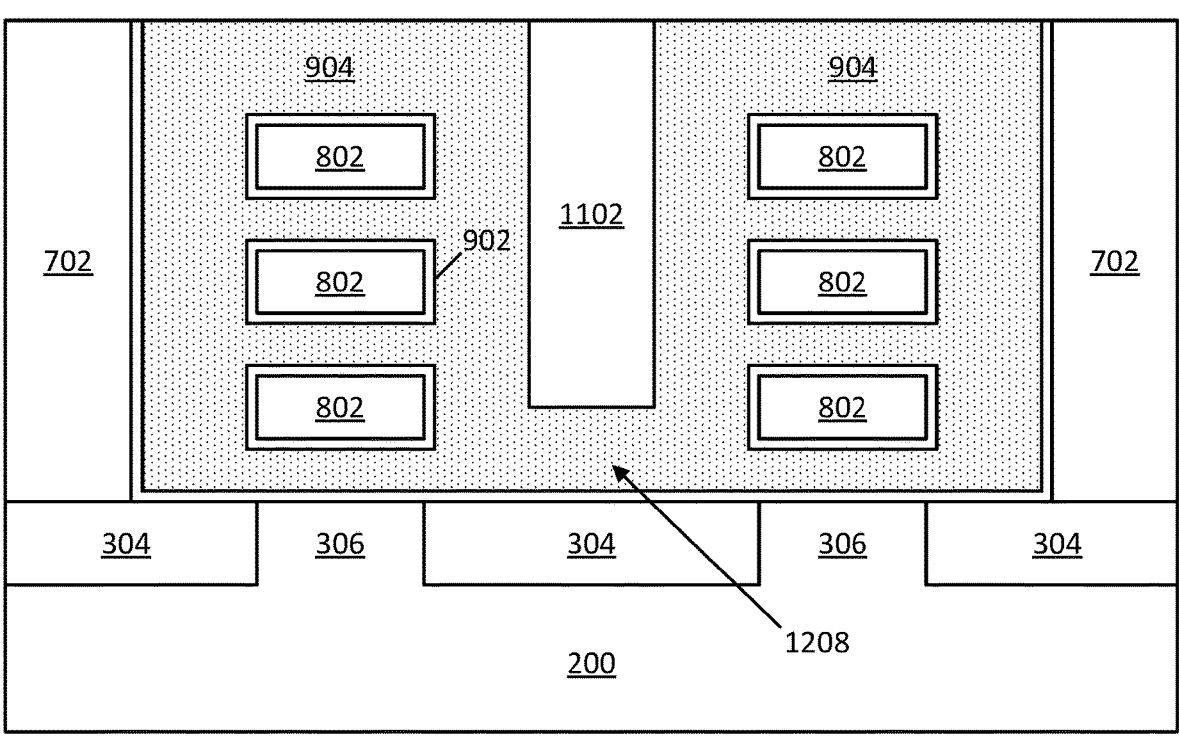
FIGS. 12C and 12D are cross-sectional views, that illustrate alternative designs of integrated circuit configured with a partial gate cut structure, in accordance with an embodiment of the present disclosure.
Figure 12D:
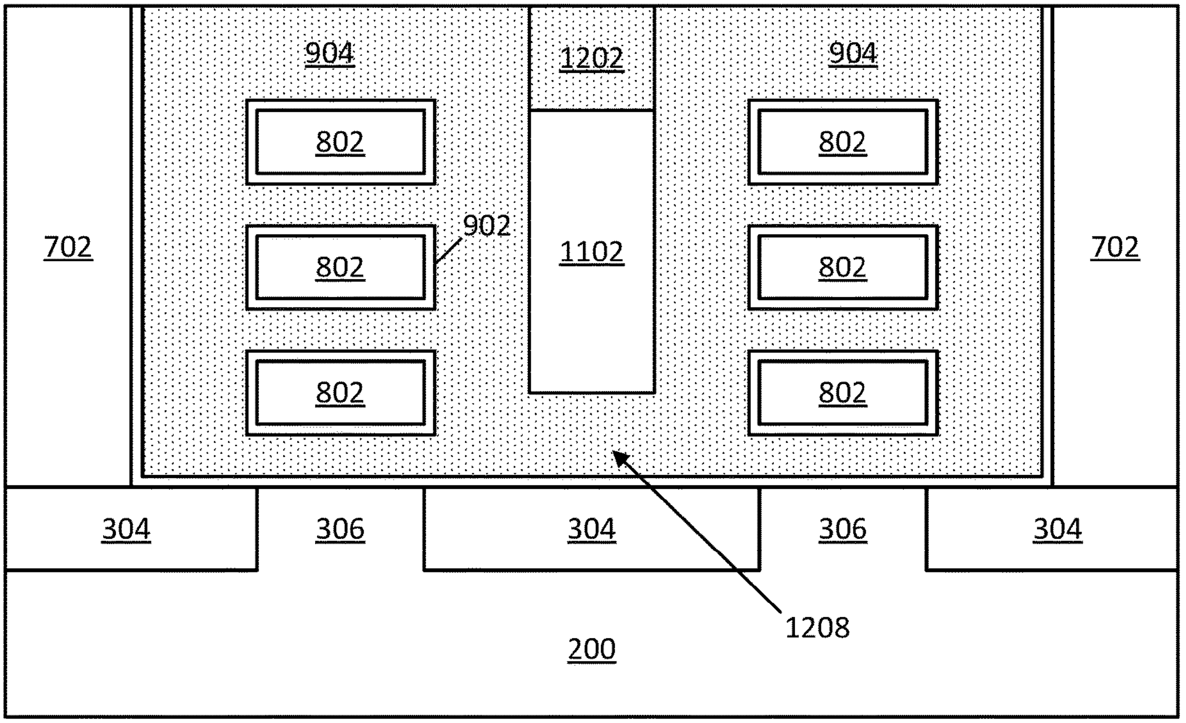

As noted above, various partial gate structures could be used to remove portions of gate layer 904 without fully interrupting gate layer 904. FIG. 12C illustrates another example of dielectric pillar 1102 that includes a lower bridge region 1208 to connect gate layer 904 across the adjacent semiconductor devices. In the example of FIG. 12C, lower bridge region 1208 includes the same conductive material as gate layer 904 and the recess used to form dielectric pillar 1102 does not fully extend through the entire thickness of gate layer 904. FIG. 12D illustrates another example of dielectric pillar 1102 that includes both conductive bridge 1202 over its top surface and lower bridge region 1208 beneath its bottom surface. The choice of design for dielectric pillar 1102 may be influenced by how contacts are made to gate layer 904. For example, if top side contacts are being used to couple with gate layer 904, designs that utilize conductive bridge 1202 may be preferable, and/or if backside contacts are being used to couple with gate layer 904, designs that utilize lower bridge region 1208 may be preferable.

Figure 13:
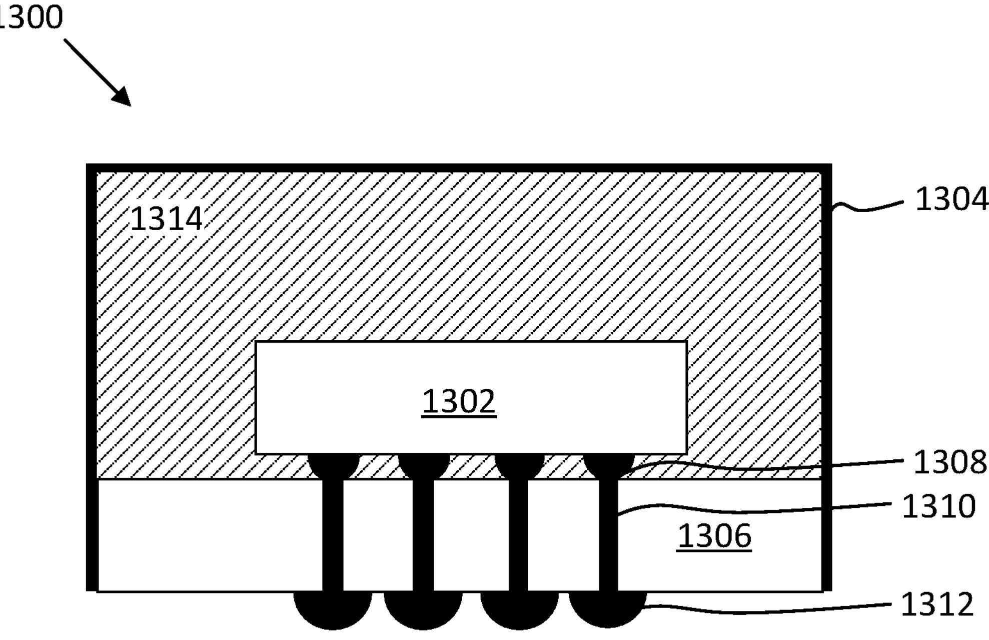
FIG. 13 illustrates a cross-section view of a chip package containing one or more semiconductor dies, in accordance with some embodiments of the present disclosure.

FIG. 13 illustrates an example embodiment of a chip package 1300, in accordance with an embodiment of the present disclosure. As can be seen, chip package 1300 includes one or more dies 1302. One or more dies 1302 may include at least one integrated circuit having semiconductor devices, such as any of the semiconductor devices disclosed herein. One or more dies 1302 may include any other circuitry used to interface with other devices formed on the dies, or other devices connected to chip package 1300, in some example configurations.

As can be further seen, chip package 1300 includes a housing 1304 that is bonded to a package substrate 1306. The housing 1304 may be any standard or proprietary housing, and may provide, for example, electromagnetic shielding and environmental protection for the components of chip package 1300. The one or more dies 1302 may be conductively coupled to a package substrate 1306 using connections 1308, which may be implemented with any number of standard or proprietary connection mechanisms, such as solder bumps, ball grid array (BGA), pins, or wire bonds, to name a few examples. Package substrate 1306 may be any standard or proprietary package substrate, but in some cases includes a dielectric material having conductive pathways (e.g., including conductive vias and lines) extending through the dielectric material between the faces of package substrate 1306, or between different locations on each face. In some embodiments, package substrate 1306 may have a thickness less than 1 millimeter (e.g., between 0.1 millimeters and 0.5 millimeters), although any number of package geometries can be used. Additional conductive contacts 1312 may be disposed at an opposite face of package substrate 1306 for conductively contacting, for instance, a printed circuit board (PCB). One or more vias 1310 extend through a thickness of package substrate 1306 to provide conductive pathways between one or more of connections 1308 to one or more of contacts 1312. Vias 1310 are illustrated as single straight columns through package substrate 1306 for ease of illustration, although other configurations can be used (e.g., damascene, dual damascene, through-silicon via, or an interconnect structure that meanders through the thickness of substrate 1306 to contact one or more intermediate locations therein). In still other embodiments, vias 1310 are fabricated by multiple smaller stacked vias, or are staggered at different locations across package substrate 1306. In the illustrated embodiment, contacts 1312 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 1312, to inhibit shorting.

In some embodiments, a mold material 1314 may be disposed around the one or more dies 1302 included within housing 1304 (e.g., between dies 1302 and package substrate 1306 as an underfill material, as well as between dies 1302 and housing 1304 as an overfill material). Although the dimensions and qualities of the mold material 1314 can vary from one embodiment to the next, in some embodiments, a thickness of mold material 1314 is less than 1 millimeter. Example materials that may be used for mold material 1314 include epoxy mold materials, as suitable. In some cases, the mold material 1314 is thermally conductive, in addition to being electrically insulating.

Methodology

Figure 14:
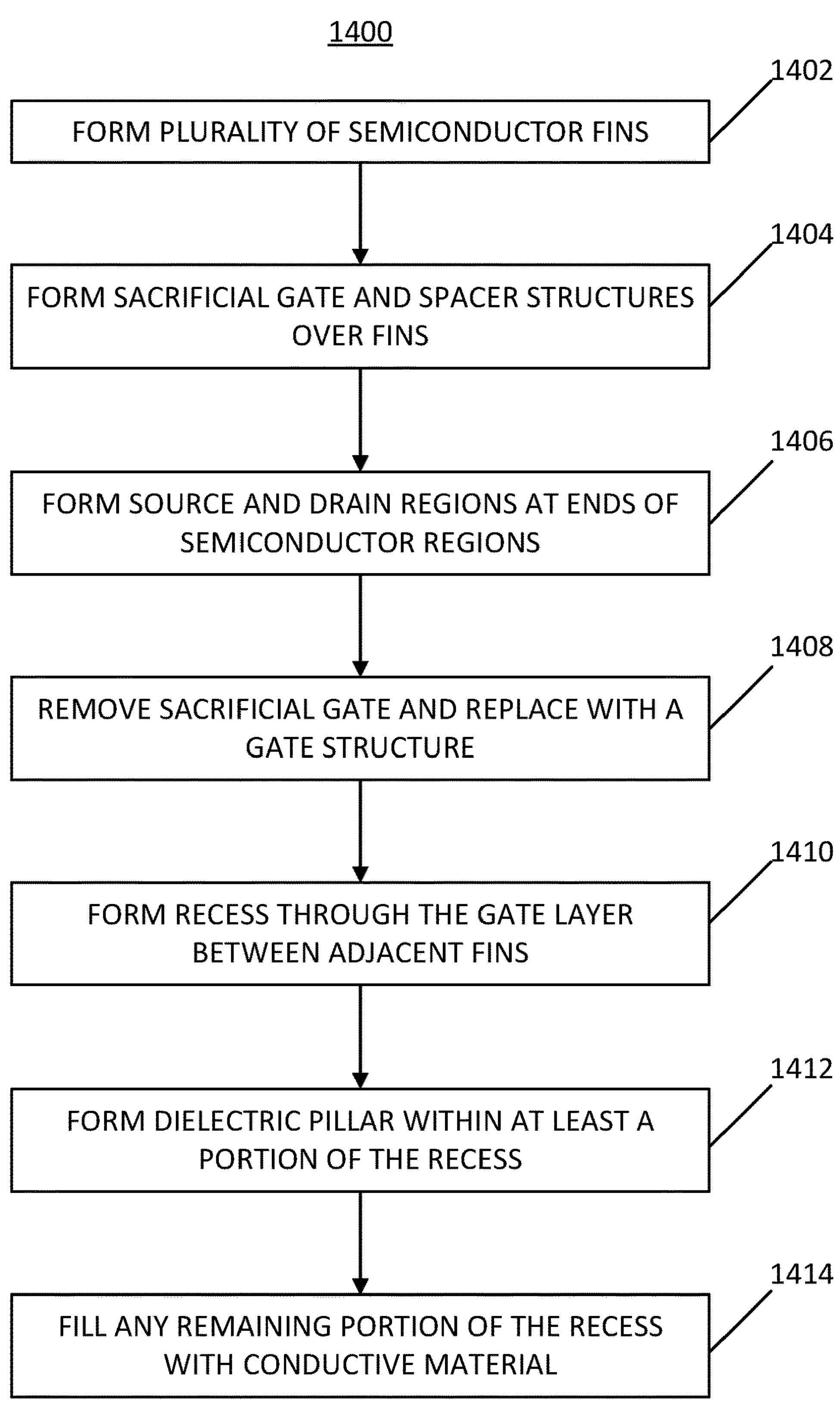
FIG. 14 is a flowchart of a fabrication process for a semiconductor device having a partial gate cut structure, in accordance with an embodiment of the present disclosure.

FIG. 14 is a flow chart of a method 1400 for forming at least a portion of an integrated circuit, according to an embodiment. Various operations of method 1400 may be illustrated in FIGS. 2A-12A and 2B-12B. However, the correlation of the various operations of method 1400 to the specific components illustrated in the aforementioned figures is not intended to imply any structural and/or use limitations. Rather, the aforementioned figures provide one example embodiment of method 1400. Other operations may be performed before, during, or after any of the operations of method 1400. For example, method 1400 does not explicitly describe many steps that are performed to form common transistor structures. Some of the operations of method 1400 may be performed in a different order than the illustrated order.

Method 1400 begins with operation 1402 where a plurality of parallel semiconductor fins are formed, according to some embodiments. The semiconductor material in the fins may be formed from a substrate such that the fins are an integral part of the substrate (e.g., etched from a bulk silicon substrate). Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fins include alternating layers of material (e.g., alternating layers of silicon and SiGe) that facilitates forming of nanowires and nanoribbons during a gate forming process where one type of the alternating layers are selectively etched away so as to liberate the other type of alternating layers within the channel region, so that a gate-all-around (GAA) process can then be carried out. Again, the alternating layers can be blanket deposited and then etched into fins, or deposited into fin-shaped trenches. The fins may also include a cap structure over each fin that is used to define the locations of the fins during, for example, an RIE process. The cap structure may be a dielectric material, such as silicon nitride.

Method 1400 continues with operation 1404 where a sacrificial gate and spacer structures are formed over the fins. The sacrificial gate may be patterned using a gate masking layer in a strip that runs orthogonally over the fins (many gate masking layers and corresponding sacrificial gates may be formed parallel to one another (e.g., forming a cross-hatch pattern with the fins). The gate masking layer may be any suitable hard mask material, such as CHM or silicon nitride. The sacrificial gate may be formed from any suitable material that can be selectively removed at a later time without damaging the semiconductor material of the fins. In one example, the sacrificial gate includes polysilicon. The spacer structures may be deposited and then etched back such that the spacer structures remain mostly only on sidewalls of any exposed structures. In some cases, spacer structures may also be formed along sidewalls of the exposed fins running out from underneath the sacrificial gate. According to some embodiments, the spacer structures may be any suitable dielectric material, such as silicon nitride or silicon oxynitride.

Method 1400 continues with operation 1406 where source or drain regions are formed at the ends of the semiconductor regions of each semiconductor device. Any portions of the fins not protected by the sacrificial gate and spacer structures may be removed using, for example, an anisotropic etching process followed by the epitaxial growth of the source or drain regions from the exposed ends of the semiconductor layers in the fins. In some example embodiments, the source or drain regions are NMOS source or drain regions (e.g., epitaxial silicon) or PMOS source or drain regions (e.g., epitaxial SiGe). A dielectric fill may be formed adjacent to the various source or drain regions for additional electrical isolation between adjacent regions. The dielectric fill may also extend over a top surface of the source or drain regions. In some embodiments, topside conductive contacts may be formed through the dielectric fill to contact one or more of the source or drain regions.

Method 1400 continues with operation 1408 where the sacrificial gate is removed and replaced with a gate structure. The sacrificial gate may be removed using an isotropic etching process that selectively removes all of the material from the sacrificial gate, thus exposing the various fins between the set of spacer structures. In the example case where GAA transistors are used, any sacrificial layers within the exposed fins between the spacer structures may also be removed to release nanoribbons, nanosheets, or nanowires of semiconductor material.

The gate structure may each include both a gate dielectric and a gate layer. The gate dielectric is first formed over the exposed semiconductor regions between the spacer structures followed by forming the gate layer within the remainder of the trench between the spacer structures, according to some embodiments. The gate dielectric may include any number of dielectric layers deposited using a CVD process, such as ALD. The gate layer can include any conductive material, such as a metal, metal alloy, or polysilicon. The gate layer may be deposited using electroplating, electroless plating, CVD, ALD, PECVD, or PVD, to name a few examples.

Method 1400 continues with operation 1410 where a recess is formed through at least the gate layer within the gate trench between adjacent fins. The recess may be formed using an anisotropic etching process through at least a thickness of the gate layer and possibly also through a portion of a thickness of any other layers beneath the gate layer. In some embodiments, portions of the gate layer remain on inner sidewalls of the spacer structures within the recess.

Method 1400 continues with operation 1412 where a dielectric pillar is formed within at least a portion of the recess. The dielectric pillar may include any number of dielectric layers that are deposited using any conventional deposition technique. According to some embodiments, the dielectric pillar is initially formed within the entirety of the recess and polished to have a planar top surface along with the surrounding gate layer. Afterwards, an isotropic etching process may be performed to recess the dielectric pillar by between about 5 nm and about 20 nm below a top surface of the gate layer. The dielectric pillar can include any suitable dielectric material, such as silicon oxide, silicon nitride, or silicon oxynitride. In some embodiments, the dielectric pillar is formed by depositing a first dielectric layer that conformally deposits (using, for example, ALD) along the inner surfaces of the recess, followed by depositing a second dielectric layer (using, for example, ALD or any other CVD technique) that fills a remaining portion of the recess.

Method 1400 continues with operation 1414 where any remaining portion of the recess is filled with a conductive material. The conductive material may have the same elemental composition as at least some portion of the gate layer. The added conductive material may act as a conductive bridge above the dielectric pillar to connect the gate structures around adjacent semiconductor devices.

As discussed above, a conductive bridge may also be formed beneath the dielectric pillar either alone or in combination with another conductive bridge above the dielectric pillar. In one example, the conductive bridge below the dielectric pillar may be formed during operation 1410 by forming the recess through only a portion of the thickness of the gate layer.

Example System

Figure 15:
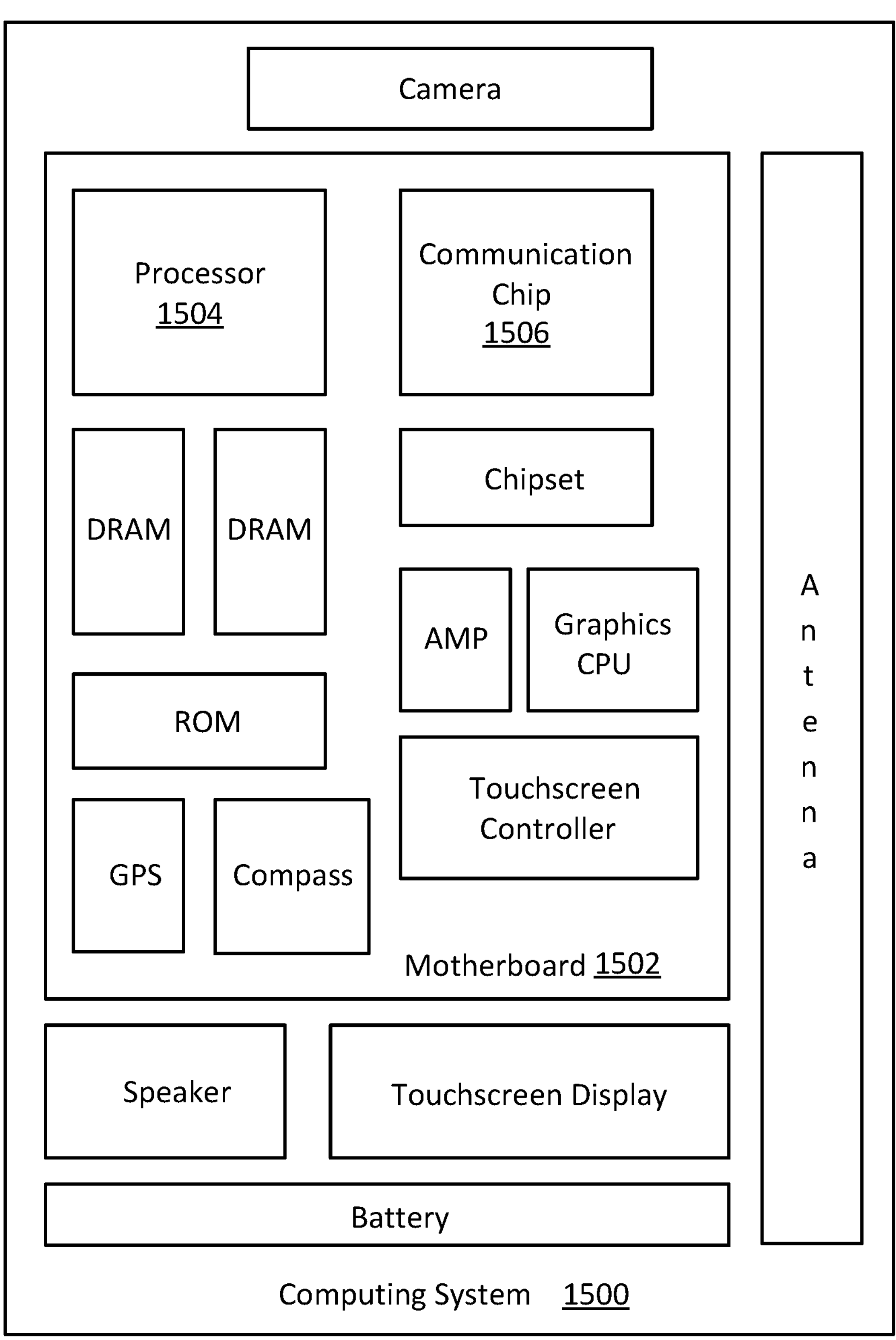
FIG. 15 illustrates a computing system including one or more integrated circuits, as variously described herein, in accordance with an embodiment of the present disclosure.

FIG. 15 is an example computing system implemented with one or more of the integrated circuit structures as disclosed herein, in accordance with some embodiments of the present disclosure. As can be seen, the computing system 1500 houses a motherboard 1502. The motherboard 1502 may include a number of components, including, but not limited to, a processor 1504 and at least one communication chip 1506, each of which can be physically and electrically coupled to the motherboard 1502, or otherwise integrated therein. As will be appreciated, the motherboard 1502 may be, for example, any printed circuit board (PCB), whether a main board, a daughterboard mounted on a main board, or the only board of system 1500, etc.

Depending on its applications, computing system 1500 may include one or more other components that may or may not be physically and electrically coupled to the motherboard 1502. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1500 may include one or more integrated circuit structures or devices configured in accordance with an example embodiment (e.g., a module including an integrated circuit device on a substrate, the substrate having one or more semiconductor devices with partial gate cut structures, as variously provided herein). In some embodiments, multiple functions can be integrated into one or more chips (e.g., for instance, note that the communication chip 1506 can be part of or otherwise integrated into the processor 1504).

The communication chip 1506 enables wireless communications for the transfer of data to and from the computing system 1500. The term “wireless” and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1506 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1500 may include a plurality of communication chips 1506. For instance, a first communication chip 1506 may be dedicated to shorter range wireless communications such as Wi-Fi and Bluetooth and a second communication chip 1506 may be dedicated to longer range wireless communications such as GPS, EDGE, GPRS, CDMA, WiMAX, LTE, Ev-DO, and others.

The processor 1504 of the computing system 1500 includes an integrated circuit die packaged within the processor 1504. In some embodiments, the integrated circuit die of the processor includes onboard circuitry that is implemented with one or more semiconductor devices as variously described herein. The term “processor” may refer to any device or portion of a device that processes, for instance, electronic data from registers and/or memory to transform that electronic data into other electronic data that may be stored in registers and/or memory.

The communication chip 1506 also may include an integrated circuit die packaged within the communication chip 1506. In accordance with some such example embodiments, the integrated circuit die of the communication chip includes one or more semiconductor devices as variously described herein. As will be appreciated in light of this disclosure, note that multi-standard wireless capability may be integrated directly into the processor 1504 (e.g., where functionality of any chips 1506 is integrated into processor 1504, rather than having separate communication chips). Further note that processor 1504 may be a chip set having such wireless capability. In short, any number of processor 1504 and/or communication chips 1506 can be used. Likewise, any one chip or chip set can have multiple functions integrated therein.

In various implementations, the computing system 1500 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 1500 may be combined or integrated in a system-on-a-chip (SoC) architecture. In some embodiments, the components may be hardware components, firmware components, software components or any suitable combination of hardware, firmware or software.

Further Example Embodiments

The following examples pertain to further embodiments, from which numerous permutations and configurations will be apparent.

Example 1 is an integrated circuit that includes a first semiconductor device having a first semiconductor region extending in a first direction between a first source region and a first drain region, and a second semiconductor device having a second semiconductor region extending in the first direction between a second source region and a second drain region. The second semiconductor device is spaced from the first semiconductor device in a second direction different from the first direction. The integrated circuit further includes a gate layer around each of the first semiconductor region and the second semiconductor region and a dielectric pillar between the first semiconductor device and the second semiconductor device, such that the gate layer extends over a top surface of the dielectric pillar or beneath a bottom surface of the dielectric pillar, or both over and beneath the dielectric pillar.

Example 2 includes the subject matter of Example 1, wherein the dielectric pillar comprises a dielectric layer along one or more edges of the dielectric pillar and a dielectric fill in a remaining volume of the dielectric pillar.

Example 3 includes the subject matter of Example 2, wherein the dielectric fill comprises a low-K dielectric material.

Example 4 includes the subject matter of any one of Examples 1-3, wherein the first semiconductor region comprises a plurality of first semiconductor nanoribbons and the second semiconductor region comprises a plurality of second semiconductor nanoribbons.

Example 5 includes the subject matter of Example 4, wherein the plurality of first semiconductor nanoribbons and the plurality of second semiconductor nanoribbons comprise germanium, silicon, or a combination thereof.

Example 6 includes the subject matter of any one of Examples 1-5, further comprising a gate dielectric layer around the first semiconductor region and the second semiconductor region, such that the gate dielectric layer is between the first semiconductor region and the gate layer and is between the second semiconductor region and the gate layer.

Example 7 includes the subject matter of Example 6, wherein the gate dielectric layer is not present on any sidewall of the dielectric pillar.

Example 8 includes the subject matter of Example 6 or 7, wherein the gate dielectric layer does not extend under or over the dielectric pillar.

Example 9 includes the subject matter of any one of Examples 1-8, wherein the dielectric pillar has a height greater than or equal to a height of the first semiconductor region or the second semiconductor region.

Example 10 includes the subject matter of any one of Examples 1-9, wherein a first distance between the dielectric pillar and the first semiconductor region in the second direction is different from a second distance between the dielectric pillar and the second semiconductor region in the second direction.

Example 11 includes the subject matter of any one of Examples 1-10, further comprising spacer structures along sidewalls of the gate layer and a conductive layer between a sidewall of the dielectric pillar and one of the spacer structures.

Example 12 is a printed circuit board comprising the integrated circuit of any one of Examples 1-11.

Example 13 is an electronic device that includes a chip package having one or more dies. At least one of the one or more dies includes a first semiconductor device having a first semiconductor region extending in a first direction between a first source region and a first drain region, and a second semiconductor device having a second semiconductor region extending in the first direction between a second source region and a second drain region. The second semiconductor device is spaced from the first semiconductor device in a second direction different from the first direction. The integrated circuit further includes a gate layer around each of the first semiconductor region and the second semiconductor region and a dielectric pillar between the first semiconductor device and the second semiconductor device, such that the gate layer extends over a top surface of the dielectric pillar or beneath a bottom surface of the dielectric pillar, or both over and beneath the dielectric pillar.

Example 14 includes the subject matter of Example 13, wherein the dielectric pillar comprises a dielectric layer along one or more edges of the dielectric pillar and a dielectric fill in a remaining volume of the dielectric pillar.

Example 15 includes the subject matter of Example 14, wherein the dielectric fill comprises a low-K dielectric material.

Example 16 includes the subject matter of any one of Examples 13-15, wherein the first semiconductor region comprises a plurality of first semiconductor nanoribbons and the second semiconductor region comprises a plurality of second semiconductor nanoribbons.

Example 17 includes the subject matter of Example 16, wherein the plurality of first semiconductor nanoribbons and the plurality of second semiconductor nanoribbons comprise germanium, silicon, or a combination thereof.

Example 18 includes the subject matter of any one of Examples 13-17, wherein the at least one of the one or more dies further comprises a gate dielectric layer around the first semiconductor region and the second semiconductor region, such that the gate dielectric layer is between the first semiconductor region and the gate layer and is between the second semiconductor region and the gate layer.

Example 19 includes the subject matter of Example 18, wherein the gate dielectric layer is not present on any sidewall of the dielectric pillar.

Example 20 includes the subject matter of any one of Examples 13-19, wherein the dielectric pillar has a height greater than or equal to a height of the first semiconductor region or the second semiconductor region.

Example 21 includes the subject matter of any one of Examples 13-20, wherein a first distance between the dielectric pillar and the first semiconductor region in the second direction is different from a second distance between the dielectric pillar and the second semiconductor region in the second direction.

Example 22 includes the subject matter of any one of Examples 13-21, further comprising a printed circuit board, wherein the chip package is coupled to the printed circuit board.

Example 23 is a method of forming an integrated circuit. The method includes forming a first fin comprising semiconductor material and a second fin comprising semiconductor material, the first and second fins extending above a substrate and each extending in a first direction; forming a gate layer extending over the first fin and the second fin in a second direction different from the first direction; forming a recess through the gate layer between the first fin and the second fin; forming a dielectric material within the recess; recessing the dielectric material within the recess; and forming a conductive material over the dielectric material, the conductive material being within the recess and coupled to the gate layer.

Example 24 includes the subject matter of Example 23, wherein forming the dielectric material comprises forming a dielectric layer along one or more edges of the recess and forming a dielectric fill within a remaining volume of the recess.

Example 25 includes the subject matter of Example 24, wherein the dielectric fill comprises a low-K dielectric material.

Example 26 includes the subject matter of any one of Examples 23-25, further comprising forming a gate dielectric layer around the semiconductor material of the first fin and the semiconductor material of the second fin before forming the gate layer.

Example 27 includes the subject matter of any one of Examples 23-26, wherein forming the recess comprises forming the recess through an entire thickness of the gate layer.

Example 28 is an integrated circuit that includes a gate layer extending in a first direction over one or more semiconductor regions of one or more corresponding semiconductor devices and a dielectric pillar adjacent to at least one of the one or more semiconductor devices and having sidewalls that contact the gate layer. The gate layer extends over a top surface of the dielectric pillar and/or beneath a bottom surface of the dielectric pillar.

Example 29 includes the subject matter of Example 28, wherein the dielectric pillar comprises a dielectric layer along one or more edges of the dielectric pillar and a dielectric fill in a remaining volume of the dielectric pillar.

Example 30 includes the subject matter of Example 29, wherein the dielectric fill comprises a low-K dielectric material.

Example 31 includes the subject matter of any one of Examples 28-30, further comprising a gate dielectric layer around the one or more semiconductor regions.

Example 32 includes the subject matter of Example 31, wherein the gate dielectric layer is not present on any sidewall of the dielectric pillar.

Example 33 includes the subject matter of Example 31 or 32, wherein the gate dielectric layer does not extend under or over the dielectric pillar.

Example 34 includes the subject matter of any one of Examples 28-33, further comprising spacer structures along sidewalls of the gate layer and a conductive layer between a sidewall of the dielectric pillar and one of the spacer structures.

Example 35 is a printed circuit board comprising the integrated circuit of any one of Examples 28-34.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit comprising:

a first semiconductor device having a first semiconductor region extending in a first direction between a first source region and a first drain region;

a second semiconductor device having a second semiconductor region extending in the first direction between a second source region and a second drain region, the second semiconductor device spaced from the first semiconductor device in a second direction different from the first direction;

a gate layer around each of the first semiconductor region and the second semiconductor region;

a gate dielectric layer around the first semiconductor region and the second semiconductor region, such that the gate dielectric layer is between the first semiconductor region and the gate layer and is between the second semiconductor region and the gate layer, wherein the gate dielectric layer comprises a high-k dielectric layer; and a dielectric pillar between the first semiconductor device and the second semiconductor device, such that the gate layer extends beneath a bottom surface of the dielectric pillar and directly contacts the entire bottom surface of the dielectric pillar, wherein the gate dielectric layer does not extend along sidewalls of the dielectric pillar.

2. The integrated circuit of claim 1, wherein the dielectric pillar comprises a dielectric layer along one or more edges of the dielectric pillar and a dielectric fill in a remaining volume of the dielectric pillar.

3. The integrated circuit of claim 1, wherein the first semiconductor region comprises a plurality of first semiconductor nanoribbons and the second semiconductor region comprises a plurality of second semiconductor nanoribbons.

4. The integrated circuit of claim 1, wherein the dielectric pillar has a height greater than or equal to a height of the first semiconductor region or the second semiconductor region.

5. The integrated circuit of claim 1, further comprising:

spacer structures along sidewalls of the gate layer; and a conductive layer between a sidewall of the dielectric pillar and one of the spacer structures.

6. The integrated circuit of claim 1, wherein a first distance between the dielectric pillar and the first semiconductor region in the second direction is different from a second distance between the dielectric pillar and the second semiconductor region in the second direction.

7. The integrated circuit of claim 1, wherein the gate layer extends over a top surface of the dielectric pillar and directly contacts the top surface of the dielectric pillar.

8. A printed circuit board comprising the integrated circuit of claim 1.

9. An electronic device, comprising:

a chip package comprising one or more dies, at least one of the one or more dies comprising a first semiconductor device having a first semiconductor region extending in a first direction between a first source region and a first drain region;

a second semiconductor device having a second semiconductor region extending in the first direction between a second source region and a second drain region, the second semiconductor device spaced from the first semiconductor device in a second direction different from the first direction;

a gate layer around each of the first semiconductor region and the second semiconductor region;

a gate dielectric layer around the first semiconductor region and the second semiconductor region, such that the gate dielectric layer is between the first semiconductor region and the gate layer and is between the second semiconductor region and the gate layer, wherein the gate dielectric layer comprises a high-k dielectric layer; and a dielectric pillar between the first semiconductor device and the second semiconductor device, such that the gate layer extends beneath a bottom surface of the dielectric pillar and directly contacts the entire bottom surface of the dielectric pillar, wherein the gate dielectric layer does not extend along sidewalls of the dielectric pillar.

10. The electronic device of claim 9, wherein the dielectric pillar comprises a dielectric layer along one or more edges of the dielectric pillar and a dielectric fill in a remaining volume of the dielectric pillar.

11. The electronic device of claim 9, wherein the first semiconductor region comprises a plurality of first semiconductor nanoribbons and the second semiconductor region comprises a plurality of second semiconductor nanoribbons.

12. The electronic device of claim 9, wherein the dielectric pillar has a height greater than or equal to a height of the first semiconductor region or the second semiconductor region.

13. The electronic device of claim 9, wherein a first distance between the dielectric pillar and the first semiconductor region in the second direction is different from a second distance between the dielectric pillar and the second semiconductor region in the second direction.

14. The electronic device of claim 9, wherein the gate layer extends over a top surface of the dielectric pillar and directly contacts the top surface of the dielectric pillar.

15. An integrated circuit comprising:

a gate layer extending in a first direction over one or more semiconductor regions of one or more corresponding semiconductor devices;

a gate dielectric layer around the one or more semiconductor regions, such that the gate dielectric layer is between the one or more semiconductor regions and the gate layer, wherein the gate dielectric layer comprises a high-k dielectric layer;

a first dielectric pillar adjacent to at least one of the one or more semiconductor devices and having a height extending along at least an entire height of the gate layer; and a second dielectric pillar adjacent to the at least one of the one or more semiconductor devices, wherein the gate layer extends beneath a bottom surface of the second dielectric pillar and directly contacts the entire bottom surface of the second dielectric pillar, and wherein the gate dielectric layer extends along a sidewall of the first dielectric pillar and does not extend along sidewalls of the second dielectric pillar.

16. The integrated circuit of claim 15, wherein the second dielectric pillar comprises a dielectric layer along one or more edges of the second dielectric pillar and a dielectric fill in a remaining volume of the second dielectric pillar.

17. The integrated circuit of claim 15, further comprising:

spacer structures along sidewalls of the gate layer; and a conductive layer between a sidewall of the second dielectric pillar and one of the spacer structures.

18. The integrated circuit of claim 15, wherein the second dielectric pillar has a height greater than or equal to a height of the one or more semiconductor regions.

19. The integrated circuit of claim 15, wherein the one or more semiconductor regions comprise a plurality of semiconductor nanoribbons.

20. The integrated circuit of claim 15, wherein the gate layer extends over the top surface of the dielectric pillar and extends beneath the bottom surface of the dielectric pillar.

* * * * *